US012279429B2

(12) United States Patent
Kong et al.

(10) Patent No.: US 12,279,429 B2
(45) Date of Patent: *Apr. 15, 2025

(54) THREE-DIMENSIONAL MEMORY DEVICES WITH SUPPORTING STRUCTURE FOR STAIRCASE REGION AND SPACER STRUCTURE FOR CONTACT STRUCTURE AND METHODS FOR FORMING THE SAME

(71) Applicant: YANGTZE MEMORY TECHNOLOGIES CO., LTD., Wuhan (CN)

(72) Inventors: Cuicui Kong, Wuhan (CN); Zhong Zhang, Wuhan (CN); Linchun Wu, Wuhan (CN); Kun Zhang, Wuhan (CN); Wenxi Zhou, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 893 days.

This patent is subject to a terminal disclaimer.

(21) Appl. No.: 17/147,388

(22) Filed: Jan. 12, 2021

(65) Prior Publication Data

US 2022/0130854 A1 Apr. 28, 2022

Related U.S. Application Data

(63) Continuation of application No. PCT/CN2020/123597, filed on Oct. 26, 2020.

(51) Int. Cl.
*H10B 43/27* (2023.01)
*H10B 41/10* (2023.01)
(Continued)

(52) U.S. Cl.
CPC .............. *H10B 43/27* (2023.02); *H10B 41/10* (2023.02); *H10B 41/27* (2023.02); *H10B 43/10* (2023.02)

(58) Field of Classification Search
CPC ........ H10B 43/27; H10B 41/10; H10B 41/27; H10B 43/10; H10B 43/40; H10B 43/50; H10B 43/35
See application file for complete search history.

(56) References Cited

U.S. PATENT DOCUMENTS

| 10,192,878 B1* | 1/2019 | Tsutsumi ............... H10B 43/10 |
| 2013/0062681 A1 | 3/2013 | Fujiki et al. |

(Continued)

FOREIGN PATENT DOCUMENTS

| CN | 109863597 A | 6/2019 |
| CN | 110088905 A | 8/2019 |

(Continued)

OTHER PUBLICATIONS

International Search Report issued in corresponding International Application No. PCT/CN2020/123597, mailed Jul. 26, 2021, 4 pages.

*Primary Examiner* — Fernando L Toledo
*Assistant Examiner* — Jahae Kim
(74) *Attorney, Agent, or Firm* — BAYES PLLC

(57) ABSTRACT

Embodiments of 3D memory devices and methods for forming the same are disclosed. In an example, a 3D memory device includes a memory stack, a semiconductor layer, a supporting structure, a spacer structure, and a contact structure. The memory stack includes interleaved conductive layers and dielectric layers and includes a staircase region in a plan view. The semiconductor layer is in contact with the memory stack. The supporting structure overlaps the staircase region of the memory stack and is coplanar with the semiconductor layer. The supporting structure includes a material other than a material of the semiconductor layer. The spacer structure is outside the memory stack and is coplanar with the supporting structure and the semiconduc- (Continued)

tor layer. The contact structure extends vertically and is surrounded by the spacer structure.

19 Claims, 17 Drawing Sheets

(51) Int. Cl.
*H10B 41/27* (2023.01)
*H10B 43/10* (2023.01)

(56) References Cited

U.S. PATENT DOCUMENTS

| | | | |
|---|---|---|---|
| 2018/0122904 | A1 | 5/2018 | Matsumoto et al. |
| 2018/0138194 | A1* | 5/2018 | Shigemura ............ H01L 23/528 |
| 2019/0326315 | A1* | 10/2019 | Lee ................... H01L 29/42344 |
| 2020/0219895 | A1 | 7/2020 | Mushiga et al. |

FOREIGN PATENT DOCUMENTS

| | | |
|---|---|---|
| CN | 110729306 A | 1/2020 |
| CN | 111223866 A | 6/2020 |
| CN | 111373532 A | 7/2020 |
| CN | 111801799 A | 10/2020 |
| WO | 2020146051 A1 | 7/2020 |

* cited by examiner

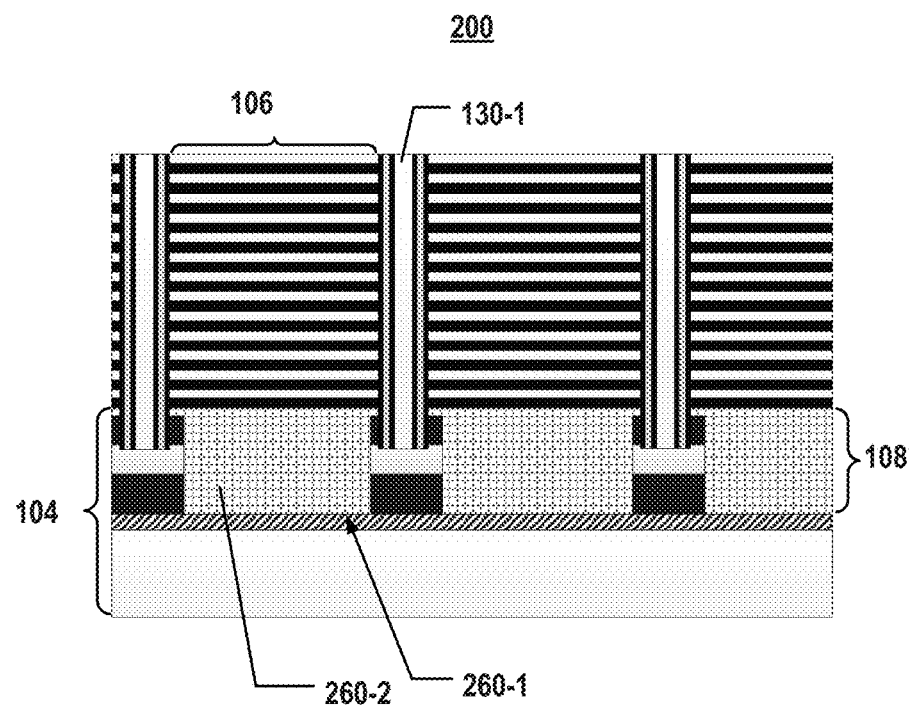
FIG. 2C
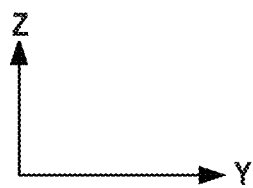

800

THREE-DIMENSIONAL MEMORY DEVICES WITH SUPPORTING STRUCTURE FOR STAIRCASE REGION AND SPACER STRUCTURE FOR CONTACT STRUCTURE AND METHODS FOR FORMING THE SAME

CROSS-REFERENCE TO RELATED APPLICATIONS

This application is continuation of International Application No. PCT/CN2020/123597, filed on Oct. 26, 2020, entitled "THREE-DIMENSIONAL MEMORY DEVICES WITH SUPPORTING STRUCTURE FOR STAIRCASE REGION AND SPACER STRUCTURE FOR CONTACT STRUCTURE AND METHODS FOR FORMING THE SAME," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for forming the same are disclosed herein.

In one example, a 3D memory device includes a memory stack, a semiconductor layer, a supporting structure, a spacer structure, and a contact structure. The memory stack includes interleaved conductive layers and dielectric layers and includes a staircase region in a plan view. The semiconductor layer is in contact with the memory stack. The supporting structure overlaps the staircase region of the memory stack and is coplanar with the semiconductor layer. The supporting structure includes a material other than a material of the semiconductor layer. The spacer structure is outside the memory stack and is coplanar with the supporting structure and the semiconductor layer. The contact structure extends vertically and is surrounded by the spacer structure.

In another example, a 3D memory device includes a memory stack, a semiconductor layer, a supporting structure, a spacer structure, a channel structure, and a contact structure. The memory stack includes interleaved conductive layers and dielectric layers and includes a staircase region in a plan view. The semiconductor layer is in contact with the memory stack. The supporting structure overlaps the staircase region of the memory stack and is coplanar with the semiconductor layer. The supporting structure includes a material other than a material of the semiconductor layer. The spacer structure is outside the memory stack and is coplanar with the supporting structure and the semiconductor layer. The channel structure is in the core array region of the memory stack and is into the semiconductor layer. The channel structure includes a semiconductor channel, and a lower portion of the semiconductor channel is in contact with the semiconductor layer. The contact structure extends vertically and is surrounded by the spacer structure.

In still another example, a method for forming a 3D memory device is disclosed. A semiconductor layer including a sacrificial layer is formed on a substrate. A supporting structure and a spacer structure are simultaneously formed in the semiconductor layer. The supporting structure and the spacer structure are coplanar with the semiconductor layer. A dielectric stack including a staircase region is formed in contact with the semiconductor layer. The staircase region overlaps with the supporting structure. A contact structure extending vertically and surrounded by the spacer structure is formed.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 2A-2C illustrate another exemplary 3D memory devices with supporting structures for staircase regions and spacer structures for contact structures, according to various embodiments of the present disclosure.

Figure 1A:
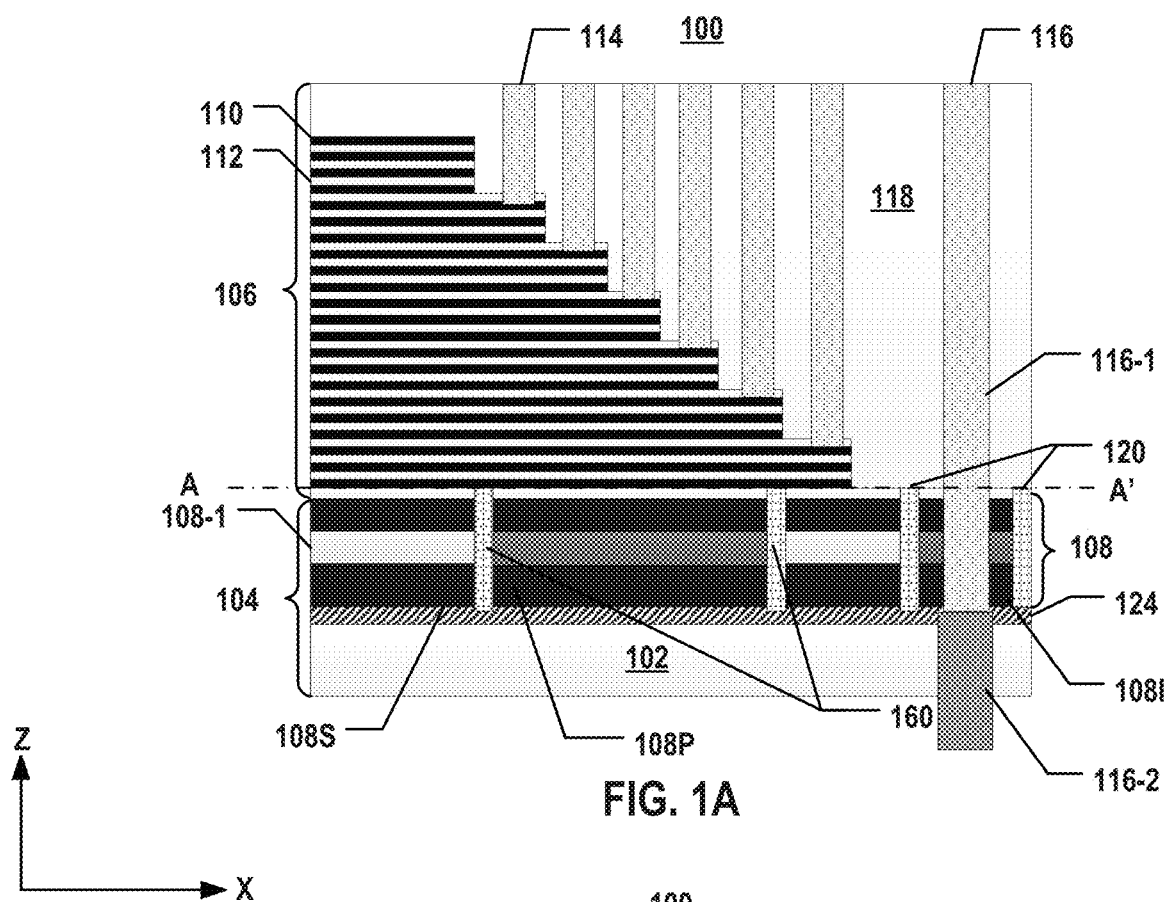
FIGS. 1A-1C illustrate exemplary 3D memory devices with supporting structures for staircase regions and spacer structures for contact structures, according to various embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or vertical interconnect access (via) contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D NAND memory devices, semiconductor plugs are selectively grown to surround the sidewalls of channel structures, e.g., known as sidewall selective epitaxial growth (SEG). Compared with another type of semiconductor plugs that are formed at the lower ends of the channel structures, e.g., bottom SEGs, the formation of sidewall SEGs avoids the etching of the memory film and semiconductor channel at the bottom surface of channel holes (also known as "SONO" punch), thereby increasing the process window, in particular when fabricating 3D NAND memory devices with advanced technologies, such as having 96 or more levels with a multi-deck architecture.

Sidewall SEGs are usually formed by replacing a sacrificial layer between the substrate and a memory stack with the sidewall SEGs, which involves multiple deposition and etching processes through the slit openings. However, since the sacrificial layer is a continuous layer extending across both the core array region and the staircase region of the memory stack, in fabricating the sidewall SEGs, the removal of the sacrificial layer and parts of the memory films (e.g., having silicon oxide and silicon nitride) to expose the semiconductor channels can result in lack of support for the memory stack in the staircase region, causing the memory stack to collapse.

Moreover, the sidewall SEGs can be combined with backside processes to form source contact structures from the backside of the substrate to, e.g., avoid leakage current and parasitic capacitance between front side source contact structures and word lines, increasing the effective device area. Peripheral contacts, such as through-silicon contacts (TSCs), formed in the peripheral region and facilitating electrical contact between memory cells and peripheral circuits, can also be formed using backside processes in these 3D NAND memory devices. However, the fabrication of peripheral contacts faces challenges because of increasing levels of the 3D NAND memory devices. Short circuits, caused by the electrical contact between the highly doped polysilicon between the bottom of the peripheral contact, may occur.

Various embodiments in accordance with the present disclosure provide 3D memory devices with supporting structures for staircase regions, and spacer structures for peripheral contacts. In the present disclosure, part of a semiconductor layer (e.g., a polysilicon layer), having a sacrificial layer, is replaced with a supporting structure overlapping with the staircase region. As used herein, one component (e.g., a layer or a structure) is "overlapping" another component (e.g., a layer or a structure) of a 3D memory device refers to the component being aligned with the other component in a vertical direction (e.g., one component is either "below" or "above" the other component). When removing the sacrificial layer to form the sidewall SEGs, the supporting structure in the staircase region can provide support to the memory stack, thereby avoiding the collapse and increasing yield. Also, by replacing part of the semiconductor layer with a spacer structure outside the memory stack (e.g., in the peripheral region), the spacer structure can surround the peripheral contacts and insulate the peripheral contacts from the semiconductor layer, thereby avoiding short circuits.

The supporting structures can have various designs as long as at least part of the supporting structure in contact with the semiconductor layer includes a material other than the material of the sacrificial layer to stop the etching into the staircase region when removing the sacrificial layer. The spacer structures can also have various designs as long as at least part of the spacer structure surrounding the peripheral contact includes a dielectric material that can insulate the peripheral contact from the semiconductor layer.

In some embodiments, to increase yield, the supporting structure and the spacer structure may include the same kind of dielectric material such as silicon oxide and/or tetraethyl orthosilicate (TEOS) and may be formed simultaneously. For example, the supporting structure and the spacer structure can be formed by the same etch process followed by the same deposition process. The etch and the deposition processes can be performed separately or incorporated into the current process flow without additional fabrication steps. For example, the etch process can be performed in any suitable etching/patterning process for forming another structure in the semiconductor device prior to the formation of the contact structure, and the deposition process can be any suitable deposition process for forming another structure in the semiconductor device prior to the formation of the contact structure. In some embodiments, the etch process is performed using a zero mask, which is employed for patterning structures in the substrate prior to the formation of any structures on a base structure (e.g., a semiconductor layer including the sacrificial layer). In some embodiments, the etch process is the same patterning process that patterns structures (e.g., bottom-select-gate cut structures in a memory stack) on the base structure. In some embodiments, the deposition process can be the same deposition process that forms the insulating structure in which a memory stack is located. The fabrication process can thus be simplified.

Figure 1B:
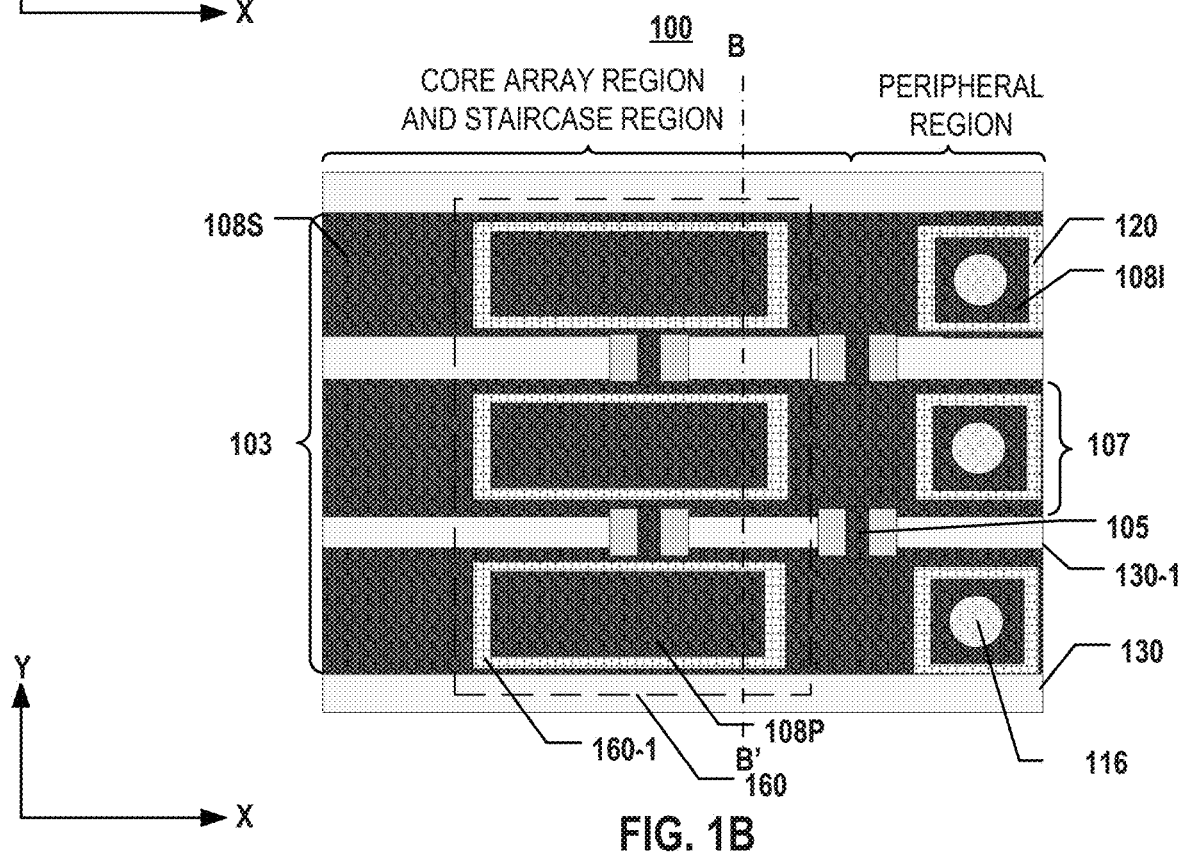
Figure 1C:
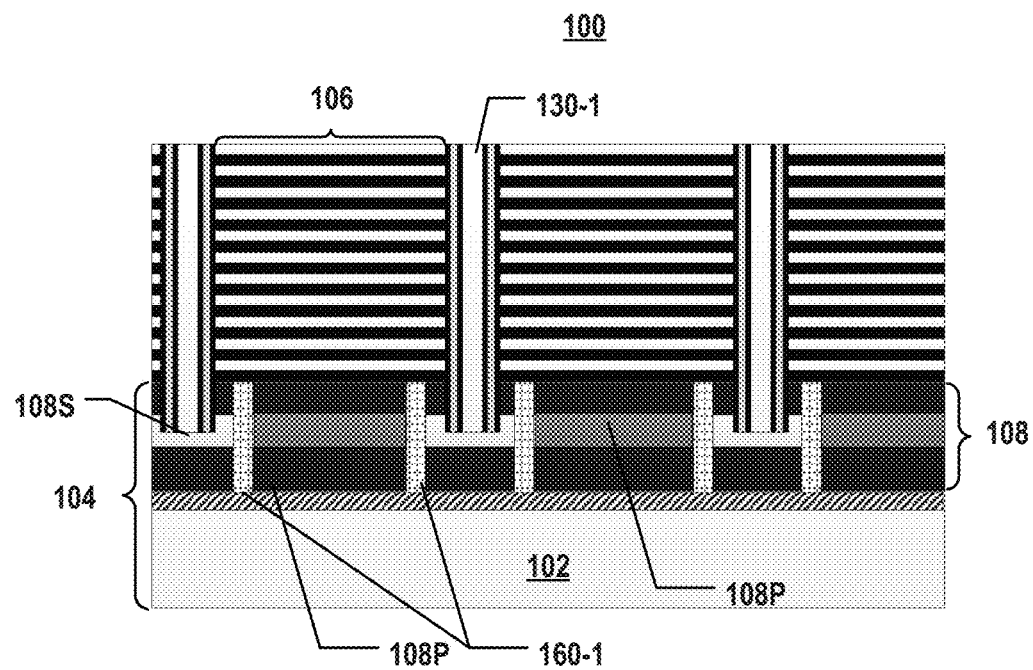

FIG. 1A illustrates a side view of a cross-section of an exemplary 3D memory device 100 with a supporting structure for a staircase region and spacer structure for contact structure, according to some embodiments of the present disclosure. FIG. 1B illustrates a section view along line A-A' of 3D memory device 100 shown in FIG. 1A, according to some embodiments. FIG. 1C illustrates a section view along line B-B' of 3D memory device 100 shown in FIG. 1B, according to some embodiments. For the ease of illustration, FIGS. 1A, 1B, and 1C are described together.

As shown in FIG. 1A, 3D memory device 100 includes a base structure 104, an insulating structure 118 over base structure 104, and a contact structure 116 extending in insulating structure 118 and base structure 104. 3D memory device 100 may also include a substrate on which base structure 104 is located on. In some embodiments, 3D memory device 100 includes a memory stack 106 over base structure 104 and in insulating structure 118. 3D memory device 100 may include a word line contact 114, in insulating structure 118, in contact with and conductively connected to memory stack 106. In some embodiments, 3D memory device 100 includes a source contact structure 126 (shown in FIG. 4 and will be described in detail below) in contact with and conductively connected to base structure 104. In some embodiments, contact structure 116 is located in a peripheral region of 3D memory device 100. Memory stack 106 may be located in a core array region and/or a staircase region of 3D memory device 100. As an example, in the present disclosure, the 3D memory devices are represented by 3D NAND memory devices, and contact structures, e.g., 116, are described as peripheral contacts in the 3D NAND memory devices. In some embodiments, contact structure 116 electrically connects a peripheral circuit and a contact pad (not shown) on opposite sides of base structure 104 of 3D memory device 100, such that the peripheral circuit can be electrically connected to external circuits through the contact pad. In some embodiments, contact structure 116 is electrically connected to a peripheral circuit and source contact structure 126 on opposite sides of base structure 104 of 3D memory device 100, such that the peripheral circuit can be electrically connected to source contact structure 126 to control the operations of the source of the 3D NAND memory device. It should be understood that the structures and fabrication methods to form these contact structures can be employed to form contact structures in any other suitable structures/devices as well.

The substrate of 3D memory device 100 can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, the substrate is a thinned substrate (e.g., a semiconductor layer), which was thinned by grinding, etching, chemical mechanical polishing (CMP), or any combination thereof. In some embodiments, the substrate is removed and not included in 3D memory device 100. It is noted that x, y, and z axes are included in figures of the present disclosure to further illustrate the spatial relationship of the components in semiconductor devices. As an example, the substrate of 3D memory device 100 includes two lateral surfaces (e.g., an upper surface and a lower surface) extending laterally in the x-direction and the y-direction (i.e., the lateral directions). The z-direction represents the direction perpendicular to the x-y plane (i.e., the plane formed by the x-direction and y-direction). As used herein, whether one component (e.g., a layer or a device) is "on," "above," or "below" another component (e.g., a layer or a device) of a 3D memory device (e.g., 3D memory device 100) is determined relative to the substrate of the semiconductor device in the z-direction (i.e., the vertical direction) when the substrate is positioned in the lowest plane of the semiconductor device in the z-direction. The same notion for describing the spatial relationships is applied throughout the present disclosure.

In some embodiments, 3D memory device 100 is part of a non-monolithic 3D NAND memory device, in which the components are formed separately on different substrates and then bonded in a face-to-face manner, a face-to-back manner, or a back-to-back manner Peripheral devices (not shown), such as any suitable digital, analog, and/or mixed-signal peripheral circuits used for facilitating the operation of 3D memory device 100, can be formed on a separate peripheral device substrate different from the memory array substrate on which the components shown in FIG. 1A are formed. It is understood that the memory array substrate may be removed from 3D memory device 100, and the peripheral device substrate may become the substrate of 3D memory device 100. It is further understood that depending on the way how the peripheral device substrate and the memory array device substrate are bonded, the memory array devices (e.g., shown in FIG. 1A) may be in the original positions or may be flipped upside down in 3D memory device 100. For ease of reference, FIG. 1A depicts a state of 3D memory device 100 in which the memory array devices are in the original positions (i.e., not flipped upside down). However, it is understood that, in some examples, the memory array devices shown in FIG. 1A may be flipped upside down in 3D memory device 100, and their relative positions may be changed accordingly. The same notion for describing the spatial relationships is applied throughout the present disclosure.

As shown in FIG. 1A, base structure 104 can include an insulating layer 102 and a semiconductor layer 108 (e.g., a polysilicon layer) on insulating layer 102. Optionally, base structure 104 may include a stop layer 124 between insulating layer 102 and semiconductor layer 108. Insulating layer 102 can include one or more interlayer dielectric (ILD) layers (also known as "intermetal dielectric (IMD) layers") in which the interconnect lines and VIA contacts can form. The ILD layers of insulating layer 102 can include dielectric materials including, but not limited to, silicon oxide, silicon nitride, silicon oxynitride, low dielectric constant (low-k) dielectrics, or any combination thereof. In some embodiments, insulating layer 102 includes silicon oxide. Stop layer 124, if any, can be disposed directly on insulating layer 102. Stop layer 124 can be a single-layered structure or a multiple-layered structure. In some embodiments, stop layer 124 is a single-layered structure and includes a high dielectric constant (high-k) dielectric layer. In some embodiments, stop layer 124 is a double-layered structure and includes a first stop layer on a second stop layer. The first stop layer can include silicon nitride, and the second stop layer can include high-k dielectric. The high-k dielectric layer can include, for example, aluminum oxide, hafnium oxide, zirconium oxide, or titanium oxide, to name a few. In one example, stop layer 124 may include aluminum oxide. As described below in detail, since the function of stop layer 124 is to stop the etching of channel holes, supporting structure openings, and spacer structure openings, it is understood that stop layer 124 may include any other suitable materials that have a relatively high etching selectivity (e.g., greater than about 5) with respect to the materials in the layers thereabove. In some embodiments, besides functioning as an etch stop layer, stop layer 124 also functions as the backside substrate thinning stop layer.

Semiconductor layer 108 may be disposed directly on stop layer 124. In some embodiments, a pad oxide layer (e.g., a silicon oxide layer) is disposed between stop layer 124 and semiconductor layer 108 to relax the stress between semiconductor layer 108 and stop layer 124 (e.g., an aluminum oxide layer). Semiconductor layer 108 includes an N-type doped polysilicon layer, according to some embodiments. That is, semiconductor layer 108 can be doped with any suitable N-type dopants, such as phosphorus (P), arsenic (Ar), or antimony (Sb), which contribute free electrons and increase the conductivity of the intrinsic semiconductor. Semiconductor layer 108 may include a semiconductor sublayer 108-1 (e.g., a polysilicon sublayer) between the top and lower surfaces of semiconductor layer 108. For example, semiconductor sublayer 108-1 may be formed by replacing at least part of a sacrificial sublayer of an initial semiconductor layer (e.g., having a sacrificial sublayer between the top and lower surfaces and later forms semiconductor layer 108), and may be conductively connected to the semiconductor channel of a 3D NAND memory string and the source contact structure of 3D memory device 100 3D memory device 100. As described below in detail, due to a diffusion process, semiconductor layer 108 can have a suitable uniform doping concentration profile in the vertical direction. It is understood that as semiconductor sublayer 108-1 of semiconductor layer 108 may have the same polysilicon material as the rest of semiconductor layer 108, and the doping concentration may be uniform in semiconductor layer 108 after diffusion, semiconductor sublayer 108-1 may not be distinguishable from the rest of semiconductor layer 108 in 3D memory device 100. Nevertheless, semiconductor sublayer 108-1 refers to the part of semiconductor layer 108 that is in contact with the semiconductor channel, instead of the memory film, in the lower portion of the channel structure.

Although FIG. 1A shows that semiconductor layer 108 is above stop layer 124 as described above, it is understood that stop layer 124 may be above semiconductor layer 108 in some examples because the memory array devices shown in FIG. 1A may be flipped upside down, and their relative positions may be changed accordingly in 3D memory device 100. Although in the present disclosure semiconductor layer 108 is described as the conductive layer for facilitating electrical coupling between the source contact of 3D memory device 100 and memory stack 106, in various embodiments, any other suitable conductive material may also be formed between memory stack 106 and insulating layer 102 for performing similar/same functions as semiconductor layer 108.

Memory stack 106 can include a plurality of interleaved conductor layers 110 and dielectric layers 112 over semiconductor layer 108. Conductor layers 110 and dielectric layers 112 in memory stack 106 can alternate in the vertical direction. In other words, except for the ones at the top or bottom of memory stack 106, each conductor layer 110 can be adjoined by two dielectric layers 112 on both sides, and each dielectric layer 112 can be adjoined by two conductor layers 110 on both sides. Conductor layers 110 can include conductive materials including, but not limited to, tungsten (W), cobalt (Co), copper (Cu), aluminum (Al), polysilicon, doped silicon, silicides, or any combination thereof. Each conductor layer 110 can include a gate electrode (gate line) surrounded by an adhesion layer and a gate dielectric layer. The gate electrode of conductor layer 110 can extend laterally as a word line, ending at one or more staircase structures of memory stack 106. Dielectric layers 112 can include dielectric materials including, but not limited to, silicon oxide, silicon nitride, silicon oxynitride, or any combination thereof. Memory stack 106 may have a staircase structure, which includes a plurality of stairs, e.g., extending laterally along the x/y direction. Each stair may include one or more pairs of conductor layer 110 and dielectric layers 112 (referred to as conductor/dielectric layer pairs). Word line contact 114, extending in insulating structure 118, may be in contact with and conductively connected to a top conductor layer 110 of a respective stair, as shown in FIG. 1A. Word line contact 114 can include conductive materials including, but not limited to, W, Co, Cu, Al, polysilicon, doped silicon, silicides, or any combination thereof. Insulating structure 118 can include dielectric materials including, but not limited to, silicon oxide, silicon nitride, silicon oxynitride, or any combination thereof.

Figure 4:
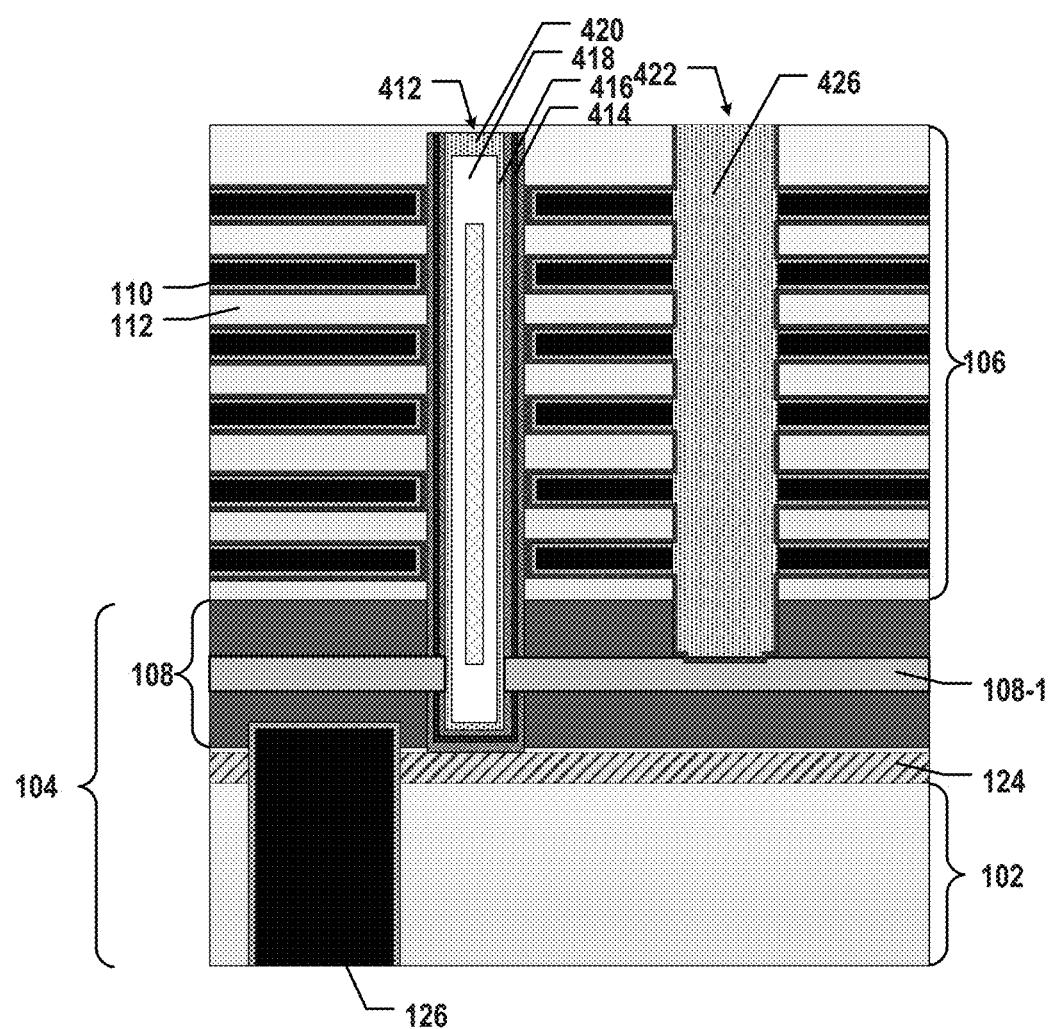
FIG. 4 illustrates part of an exemplary 3D memory device, according to various embodiments of the present disclosure.

In some embodiments, 3D memory device 100 is a 3D NAND memory device and includes a plurality of memory cells formed in the core array region of memory stack 106. The memory cells may be formed by the intersections of 3D NAND memory strings (e.g., channel structures) in memory stack 106 and conductor layers 110. FIG. 4 illustrates a cross-sectional view of a channel structure in memory stack 106.

As shown in FIG. 4, a channel structure 412 extends vertically through the core array region of memory stack 106 and semiconductor layer 108, stopping at stop layer 124, if any. That is, channel structure 412 can include two portions: the lower portion surrounded by semiconductor layer 108 (i.e., below the interface between semiconductor layer 108 and memory stack 106) and the upper portion surrounded by memory stack 106 (i.e., above the interface between semiconductor layer 108 and memory stack 106). As used herein, the "upper portion/end" of a component (e.g., channel structure 412) is the portion/end farther away from the substrate in the z-direction, and the "lower portion/end" of the component (e.g., channel structure 412) is the portion/end closer to the substrate in the z-direction when the substrate is positioned in the lowest plane of 3D memory device 100. In some embodiments, each channel structure 412 does not extend further beyond stop layer 124 as the etching of the channel hole being stopped by stop layer 124. For example, the lower end of channel structure 412 may be nominally flush with the upper surface of stop layer 124.

Channel structure 412 can include a channel hole filled with semiconductor material(s) (e.g., as a semiconductor channel 416) and dielectric material(s) (e.g., as a memory film 414). In some embodiments, semiconductor channel 416 includes silicon, such as amorphous silicon, polysilicon, or single crystalline silicon. In one example, semiconductor channel 416 includes polysilicon. In some embodiments, memory film 414 is a composite layer including a tunneling layer, a storage layer (also known as a "charge trap layer"), and a blocking layer. The remaining space of the channel hole can be partially or fully filled with a capping layer 418 including dielectric materials, such as silicon oxide, and/or an air gap. Channel structure 412 can have a cylinder shape (e.g., a pillar shape). Capping layer 418, semiconductor channel 416, the tunneling layer, the storage layer, and the blocking layer of memory film 414 are arranged radially from the center toward the outer surface of the pillar in this order, according to some embodiments. The tunneling layer can include silicon oxide, silicon oxynitride, or any combination thereof. The storage layer can include silicon nitride, silicon oxynitride, or any combination thereof. The blocking layer can include silicon oxide, silicon oxynitride, high-k dielectrics, or any combination thereof. In one example, memory film 414 can include a composite layer of silicon oxide/silicon oxynitride/silicon oxide (ONO). In some embodiments, channel structure 412 further includes a channel plug 420 at the top of the upper portion of channel structure 412. Channel plug 420 can include semiconductor materials (e.g., polysilicon). In some embodiments, channel plug 420 functions as the drain of the NAND memory string.

As shown in FIG. 4, part of semiconductor channel 416 along the sidewall of channel structure 412 (e.g., in the lower portion of channel structure 412) is in contact with semiconductor sublayer 108-1, according to some embodiments. That is, memory film 414 is disconnected in the lower portion of channel structure 412 that abuts semiconductor sublayer 108-1 of semiconductor layer 108, exposing semiconductor channel 416 to be in contact with the surrounding semiconductor sublayer 108-1, according to some embodiments. As a result, semiconductor sublayer 108-1 surrounding and in contact with semiconductor channel 416 can work as the "sidewall SEG" of channel structure 412. In some embodiments, a source contact structure 126 is in contact with semiconductor layer 108 and is electrically connected to semiconductor channel 416 through semiconductor layer 108.

As shown in FIG. 4, in some embodiments, 3D memory device 100 further includes an insulating spacer 422 extending vertically through interleaved conductor layers 110 and dielectric layers 112 of memory stack 106. In some embodiments, insulating spacer 422 extends into semiconductor layer 108 and stops at semiconductor sublayer 108-1, according to some embodiments. In some embodiments, the lower end of insulating spacer 422 is nominally flush with the upper surface of semiconductor sublayer 108-1. Each insulating spacer 422 can also extend laterally to separate channel structures 412 into a plurality of blocks. Different from the slit structures in some 3D NAND memory devices, insulating spacer 422 does not include any contact therein (i.e., not functioning as the source contact), according to some embodiments. In some embodiments, each insulating spacer 422 includes an opening (e.g., a slit) filled with one or more dielectric materials, including, but not limited to, silicon oxide, silicon nitride, silicon oxynitride, or any combination thereof. In one example, each insulating spacer 422 may be filled with silicon oxide as an insulator core 426 and high-k dielectrics connecting with the gate dielectric layers.

Source contact structure 126 may extend vertically through insulating layer 102 and stop layer 124 (if any) from the opposite side of semiconductor layer 108 with respect to stop layer 124 (i.e., the backside) to be in contact with semiconductor layer 108. It is understood that the depth that source contact structure 126 extends into semiconductor layer 108 may vary in different examples. Source contact structure 126 can electrically connect the source of the channel structure of 3D memory device 100 to the peripheral devices through semiconductor layer 108 from the backside of the memory array substrate (removed) and thus, can be referred to herein as a "backside source pick up" as well. Source contact structure 126 can include any suitable types of contacts. In some embodiments, source contact structure 126 includes a VIA contact. In some embodiments, source contact structure 126 includes a wall-shaped contact extending laterally. Source contact structure 126 can include one or more conductive layers, such as a metal layer, for example, tungsten (W), cobalt (Co), copper (Cu), or aluminum (Al) or a silicide layer surrounded by an adhesive layer (e.g., titanium nitride (TiN)).

Referring back to FIG. 1A, contact structure 116 may extend in insulating structure 118 and base structure 104 and may be conductively connected to any peripheral circuits for the operation of memory cells. In some embodiments, contact structure 116 extends through semiconductor layer 108 and insulating layer 102. Contact structure 116 may include a first contact portion 116-1 extending in insulating structure 118 and semiconductor layer 108, and a second contact portion 116-2 extending in insulating layer 102, and stop layer 124 if any. First and second contact portions 116-1 and 116-2 may be in contact with and conductively connected to each other at a contact interface. 3D memory device 100 may also include a spacer structure 120 in semiconductor layer 108 surrounding first contact portion 116-1 such that first contact portion 116-1 is insulated from semiconductor layer 108.

In some embodiments, a lateral cross-sectional area of second contact portion 116-2 is greater than or equal to a lateral cross-sectional area of first contact portion 116-1 such that first contact portion 116-1 is fully overlapped with second contact portion 116-2. The lateral cross-sections of first and second contact portions 116-1 and 116-2 can each have any suitable shapes such as oval, squared, rectangular, and circular shapes. For example, the lateral cross-section of first and second contact portions 116-1 and 116-2 may respectively be nominally circular and squared. The upper surface of second contact portion 116-2 may be sufficiently flat, e.g., nominally leveled/coplanar with the upper surface of insulating layer 102 (or stop layer 124 if any). The contact interface between first and second contact portions 116-1 and 116-2 may be coplanar (or at least nominally coplanar) with the upper surface of insulating layer 102 (or stop layer 124 if any). That is, the lower surface of first contact portion 116-1 and the upper surface of second contact portion 116-2 may each be coplanar (or at least nominally coplanar with) with the upper surface of insulating layer 102 (or stop layer 124 if any). In some embodiments, first and second contact portions 116-1 and 116-2 can each be made of tungsten, cobalt, copper, or aluminum, and/or silicide.

Spacer structure 120 may be in semiconductor layer 108, surrounding/enclosing first contact portion 116-1 such that first contact portion 116-1 (or contact structure 116) is insulated from semiconductor layer 108. For example, compared with some known 3D memory devices, part of the initial semiconductor layer (e.g., the semiconductor layer with the sacrificial sublayer between the top and lower surfaces) may be replaced with spacer structure 120 so that spacer structure 120 encloses and insulates first contact portion 116-1 of contact structure 116 from the part of the initial semiconductor layer outside spacer structure 120, before semiconductor layer 108 is formed. That is, the portion of sacrificial sublayer of the initial semiconductor layer enclosed by spacer structure 120 may not be replaced with a portion of sublayer 108-1 of semiconductor layer 108. In some embodiments, as illustrated in FIG. 1B, spacer structure 120 may have a trench structure (e.g., a ring structure) enclosing/surrounding first contact portion 116-1 (or contact structure 116) laterally. It is understood that the trench structure of spacer structure 120 may have any suitable shapes such as oval, squared, rectangular, and circular shapes in the plan view as long as the lateral dimensions of spacer structure 120 (e.g., in the x-y plane) are sufficiently large to insulate first contact portion 116-1 from semiconductor layer 108 in all directions.

For example, the trench structure of spacer structure 120 may be in a rectangular shape and divides semiconductor layer 108 into an insulating portion 108I (e.g., part of the initial semiconductor layer, the sacrificial sublayer of which is not replaced) and a sacrificial portion 108S. An upper surface of spacer structure 120, in contact with insulating structure 118, may be coplanar with the upper surface of semiconductor layer 108. A lower surface of spacer structure 120 may be in contact with insulating layer 102 (or stop layer 124 if any) such that insulating portion 108I is fully insulated from the rest part of semiconductor layer 108 (e.g., sacrificial portion 108S) by the trench structure. Accordingly, because first contact portion 116-1 is surrounded by and in contact with insulating portion 108I, even though first contact portion 116-1 may be electrically connected to insulating portion 108I, both first contact portion 116-1 and insulating portion 108I are fully insulated from the rest part of semiconductor layer 108 by the trench structure. Therefore, no additional spacer layer in contact structure 116 is needed to prevent short circuits at the bottom of first contact portion 116-1, reducing the complexity of fabricating contact structure 116 and increasing yield.

In various embodiments, the lower surface of spacer structure 120 can be leveled with or below the lower surface of semiconductor layer 108. For example, the lower surface of spacer structure 120 may be in stop layer 124 or in insulating layer 102. In some embodiments, spacer structure 120 includes a dielectric material, such as silicon oxide, silicon nitride, silicon oxynitride, TEOS, or a combination thereof. It should be understood that, if spacer structure 120 includes the same material as insulating structure 118 and/or insulating layer 102, the upper surface and/or lower surface of spacer structure 120 may not be distinguishable.

Referring back to FIG. 1A, 3D memory device 100 further includes a supporting structure 160 in semiconductor layer 108, below memory stack 106. Semiconductor layer 108 and supporting structure 160 are coplanar, i.e., in the same plane below memory stack 106, according to some embodiments. For example, compared with some known 3D memory devices, part of the initial semiconductor layer (e.g., the semiconductor layer with a sacrificial sublayer between the top and lower surfaces) may be replaced with supporting structure 160 for the staircase region of memory stack 106 before semiconductor layer 108 is formed (e.g., by replacing at least part of the sacrificial sublayer of the initial semiconductor layer). In some embodiments, supporting structure 160 at least partially overlaps with the staircase region of memory stack 106. That is, along the x-y plane, the area enclosed by supporting structure 160 can overlap at least part of the staircase region to provide support for the staircase region when replacing the sacrificial sublayer in the initial semiconductor layer. Semiconductor layer 108 can fill in the space outside supporting structure 160, e.g., between memory stack 106 and insulating layer 102 (or stop layer 124, if any). In some embodiments, semiconductor layer 108 is disposed in at least part of the core array region in which channel structures (e.g., channel structures 412 in FIG. 4) are formed. In some embodiments, semiconductor layer 108 is part of the staircase region. As shown in FIGS. 1A and 1B, supporting structure 160 is aligned with staircase region in the vertical direction (e.g., perpendicular to the x-y plane).

In some embodiments, part of supporting structure 160 in contact with semiconductor layer 108 includes a material other than, e.g., different from the material of semiconductor layer 108. For example, the part of supporting structure 160 may include silicon oxide and/or TEOS, different from polysilicon in semiconductor layer 108. As shown in FIG. 1B, in some embodiments, supporting structure 160 includes a trench structure (e.g., a ring structure) in contact with semiconductor layer 108 to prevent part of the initial semiconductor layer (e.g., the part of the sacrificial sublayer enclosed by supporting structure 160) from being replaced when semiconductor layer 108 is formed. As a result, when replacing the sacrificial sublayer, the enclosed/protected part of the sacrificial sublayer will be retained, providing support for the memory stack 106 in the staircase region so that the memory stack 106 is less susceptible to collapse.

It is understood that the trench structure of supporting structure 160 may have any suitable shapes such as oval, squared, rectangular, and circular shapes in the plan view as long as at least part of supporting structure 160 overlaps and is aligned with the staircase region of memory stack 106 and least part of supporting structure 160 in contact with the semiconductor layer includes a material other than the material of the sacrificial layer to stop the etching into the staircase region when replacing the sacrificial sublayer.

For example, as shown in FIGS. 1B and 1C, the trench structure of supporting structure 160 may be in a rectangular shape such that semiconductor layer 108 may be divided into a supporting portion 108P (e.g., part of the initial semiconductor layer, the sacrificial layer of which is not replaced) and sacrificial portion 108S. An upper surface of supporting structure 160, in contact with memory stack 106, may be coplanar with the upper surface of semiconductor layer 108. A lower surface of supporting structure 160 may be in contact with insulating layer 102 (or stop layer 124 if any) such that supporting portion 108P is fully protected by the trench structure from being etched when semiconductor layer 108 is formed (e.g., by performing the sacrificial sublayer replacement to the initial semiconductor layer). Accordingly, supporting portion 108P will provide support for the staircase region of memory stack 106 to avoid collapse when the sacrificial sublayer is replaced.

In some embodiments, for ease of production, both spacer structure 120 and supporting structure 160 may have the same kind of dielectric material, such as silicon oxide, or TEOS, to name a few. As will be described in detail below, spacer structure 120 and supporting structure 160 may also be fabricated in the same etching and deposition process. For example, the etch process may be performed using a zero mask, which is employed for patterning spacer structure 120 and supporting structure 160 in the initial semiconductor layer before the sacrificial sublayer is replaced for forming semiconductor layer 108.

As shown in the plan view of FIG. 1B, 3D memory device 100 includes a plurality of memory blocks 103 (for ease of illustration, only one memory block 103 is shown) separated by slit structures 130 (e.g., first slit structures). It is noted that x and y axes are included in FIG. 1B to illustrate two orthogonal directions in the substrate plane. The x-direction is the word line direction, and the y-direction is the bit line direction. Adjacent memory blocks 103 arranged in the y-direction (e.g., the bit line direction) are separated by a respective slit structure 130 extending laterally in the x-direction (e.g., the word line direction). In each memory block 103, slit structures 130-1 having "H" cuts 105 (e.g., second slit structures) further separate memory block 103 into multiple memory fingers 107, each of which includes an array of channel structures (e.g., channel structures 412 shown in FIG. 4) in the core array region. That is, slit structure 130 between memory blocks 103 is a continuous structure through the memory plane, which cuts off memory stack 106 between adjacent memory blocks 103, whereas slit structure 130-1 between memory fingers 107 within memory block 103 includes one or more "H" cuts 105 that connect memory stack 106 between adjacent memory fingers 107. As illustrated in FIG. 1C, slit structure 130-1 with "H" cuts 105 extends laterally through the entire memory stack 106 and stops in semiconductor layer 108. As illustrated in FIGS. 1B and 1C, supporting structure 160 is divided by slit structure 130-1 with "H" cuts 105 into multiple sub-supporting structures 160-1, each sub-supporting structure 160-1 corresponds to (e.g., overlaps and/or aligned with) one memory finger 106, and thus, can provide support to corresponding fingers during sacrificial sublayer replacement.

Figure 2A:
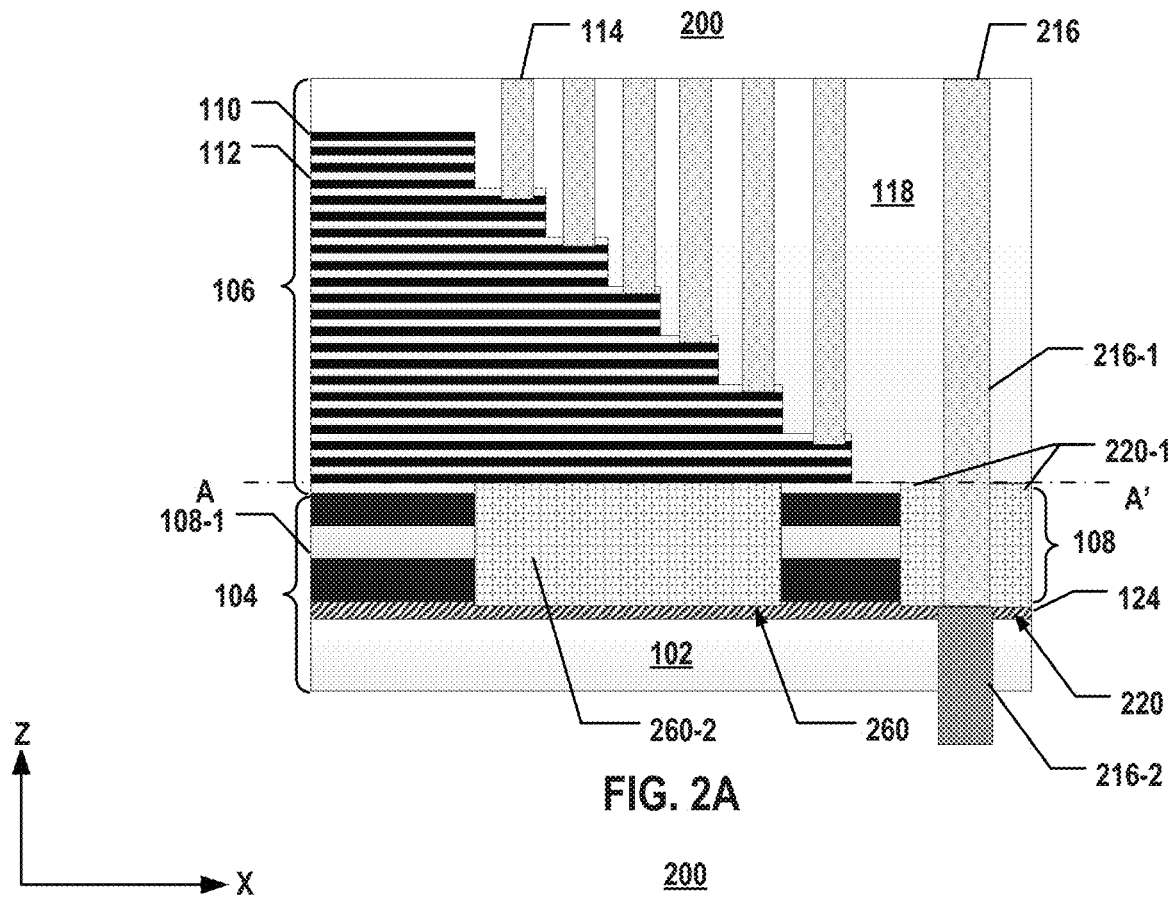
Figure 2B:
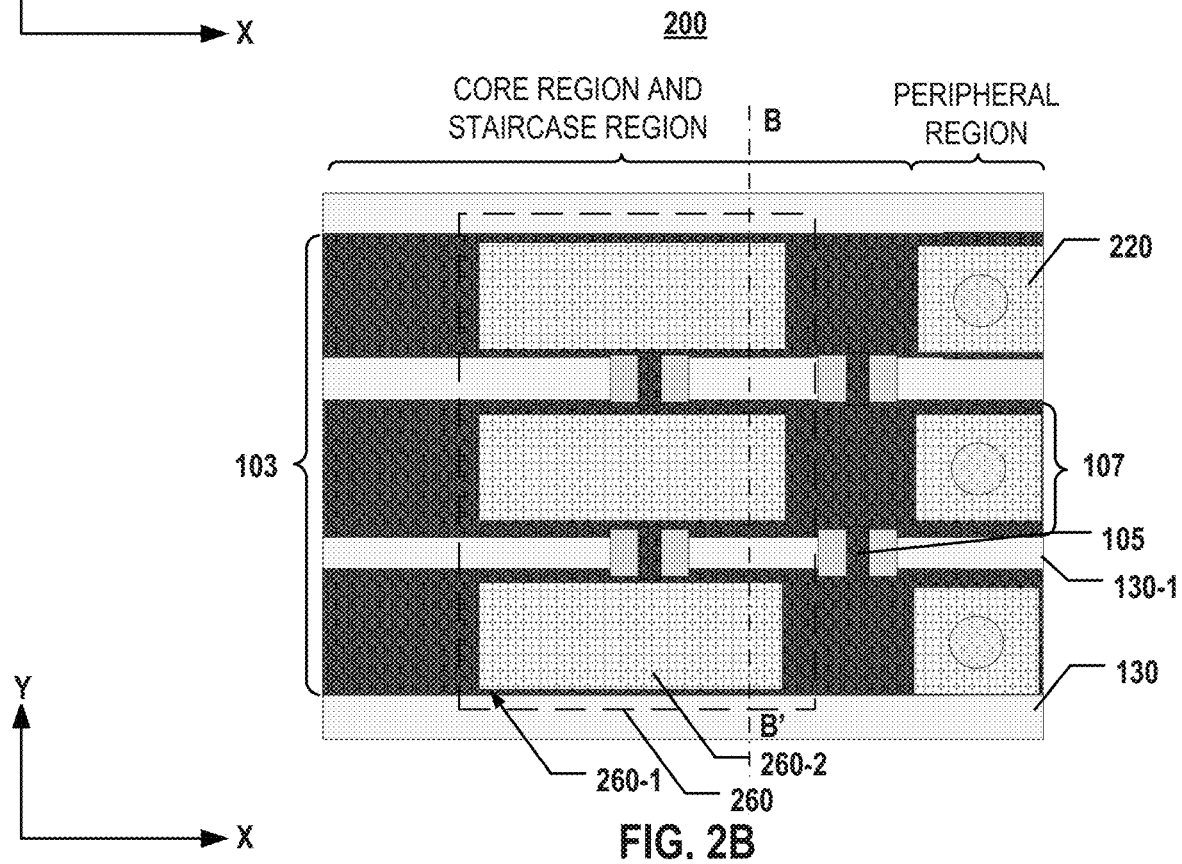

FIG. 2A illustrates a side view of a cross-section of another exemplary 3D memory device 200 with a supporting structure for a staircase region and spacer structures for contact structures, according to some embodiments. FIG. 2B illustrates a section view along line A-A' of 3D memory device 200 shown in FIG. 2A, according to some embodiments. FIG. 2C illustrates a section view along line B-B' of 3D memory device 200 shown in FIG. 2B, according to some embodiments. For the ease of illustration, FIGS. 2A, 2B, and 2C are described together, and the details of the same structures in both 3D memory devices 100 and 200 are not repeated for ease of description.

As shown in FIG. 2A, 3D memory device 200 includes a contact structure 216, a spacer structure 220, and a supporting structure 260. Contact structure 216 may include a first contact portion 216-1 and a second contact portion 216-2 in contact with and conductively connected to each other. Contact structure 216 may extend through spacer structure 220 such that spacer structure 220 insulates contact structure 216 from semiconductor layer 108. Different from spacer structure 120, instead of having a trench structure dividing semiconductor layer 108 into different parts, spacer structure 220 may have a well structure 220-1 filled with a dielectric material (e.g., taking up the entire space that is enclosed by spacer structure 220). For example, first contact portion 216-1 (or contact structure 216) may extend through and in contact with spacer structure 220 (e.g., in contact with the dielectric material of spacer structure 220) such that first contact portion 216-1 is insulated from semiconductor layer 108 by well structure 220-1 of spacer structure 220. It is understood that well structure 220-1 of spacer structure 220 may have any suitable shape such as oval, squared, rectangular, and circular shapes in the plan view as long as the lateral dimensions of spacer structure 220 (e.g., in the x-y plane) is sufficiently large to insulate first contact portion 216-1 from semiconductor layer 108 in all directions. It is also understood that the shape of well structure 220-1 can be the same or different from the shape of the contact structure. The other properties of first and second contact portions 216-1 and 216-2, and spacer structure 220, such as the material, the position of the upper and lower surface, etc., may respectively be similar to or the same as those for first and second contact portions 116-1 and 116-2 and spacer structure 120, and the detailed description is not repeated herein.

Moreover, different from supporting structure 160, instead of having a trench structure dividing semiconductor layer 108 into different parts, supporting structure 260 may also have a well structure 260-2 filled with a material different than the material of semiconductor layer 108 (e.g., taking up the entire space that supporting structure 260 encloses). For example, supporting structure 260 may include a well structure 260-2 (e.g., filled with a dielectric material) taking up the entire space enclosed by supporting structure 260. It is understood that well structure 260-2 of supporting structure 260 may have any suitable shape such as oval, squared, rectangular, and circular shapes in the plan view so long as at least part of well structure 260-2 overlaps and is aligned with the staircase region of memory stack 106 and at least part of supporting structure 260 in contact with the semiconductor layer includes a material other than the material of the sacrificial sublayer to stop the etching into the staircase region when replacing the sacrificial sublayer. Similar to supporting structure 160, supporting structure 260 may also be divided into multiple sub-supporting structures 260-1 by slit structures 130-1 with "H" cuts 105. The material and the position of the upper and lower surface of supporting structure 260 may respectively be similar to or the same as those for supporting structure 160, and the detailed description is not repeated herein.

Although in 3D memory device 100, both spacer structure 120 and supporting structure 160 have a trench structure, and in 3D memory device 200, both spacer structure 220 and supporting structure 260 have a well structure, it is understood that the embodiments of the trench structure and the well structure are interchangeable. That is, in some embodiments, 3D memory device 100 may have a spacer structure with a trench structure and a supporting structure with a well structure. In some other embodiments, 3D memory device 200 may have a spacer structure with a well structure and a supporting structure with a trench structure.

Figure 3A:
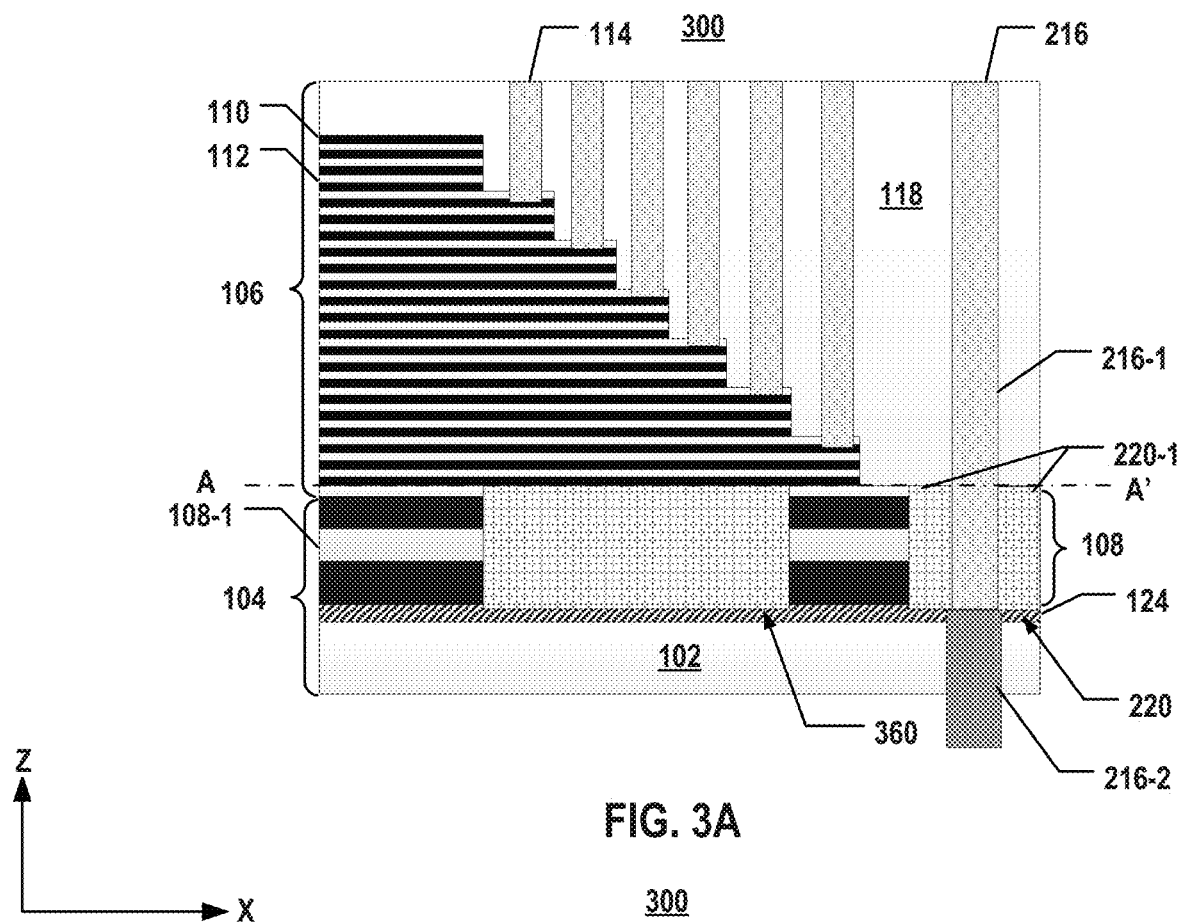
FIGS. 3A-3C illustrate another exemplary 3D memory devices with supporting structures for staircase regions and spacer structures for contact structures, according to various embodiments of the present disclosure.
Figure 3B:
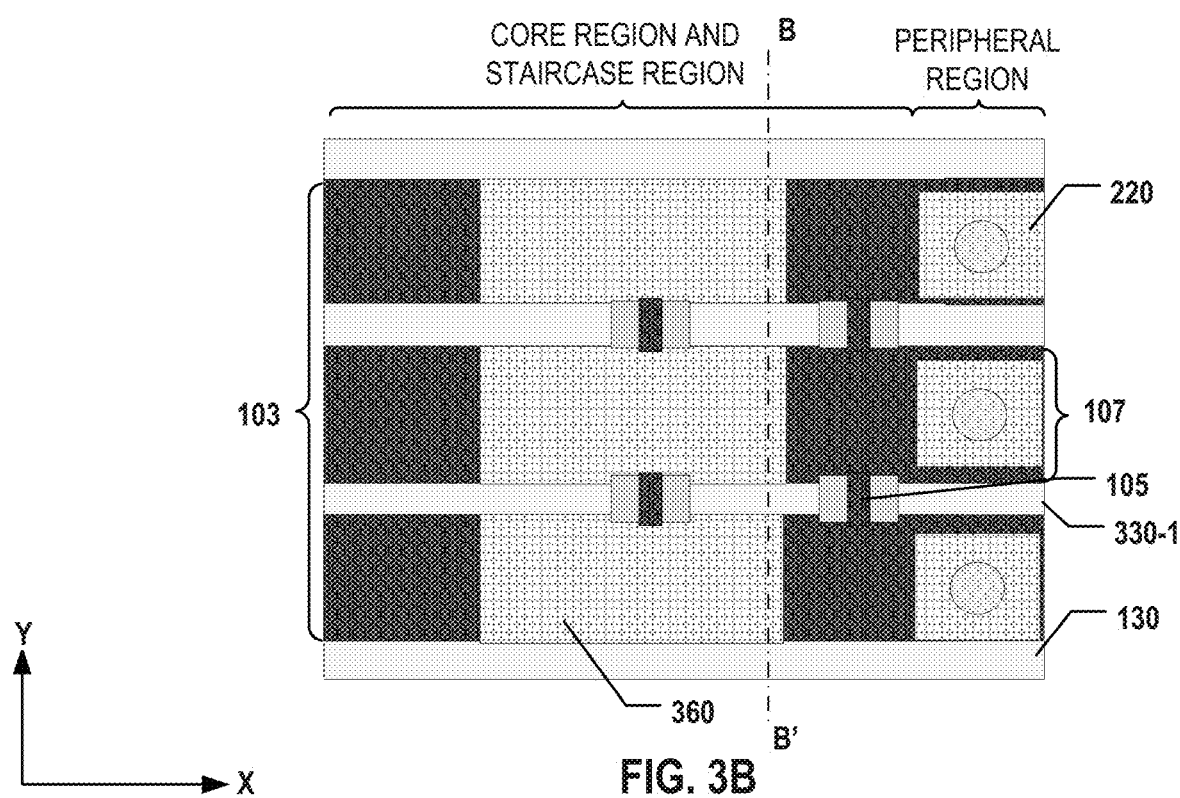
Figure 3C:
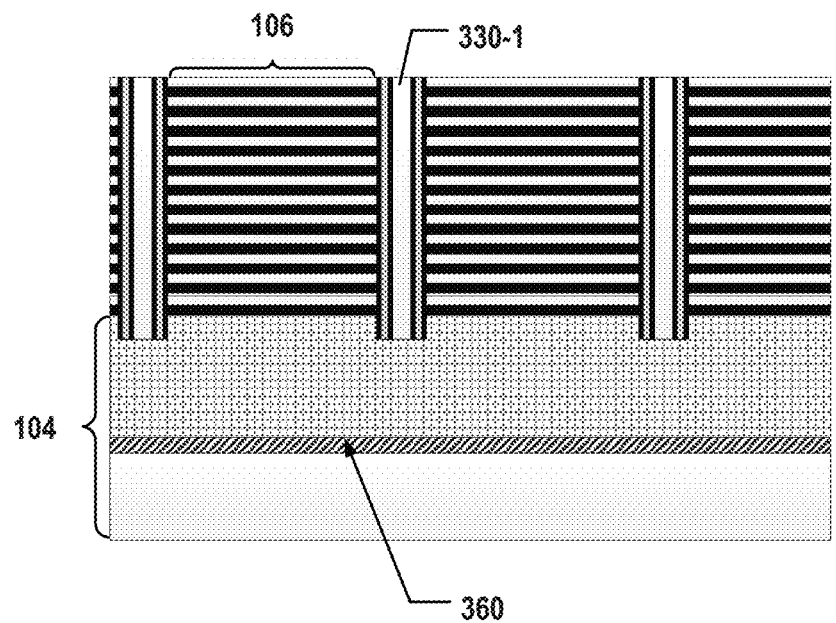

FIG. 3A illustrates a side view of a cross-section of another exemplary 3D memory device 300 with a supporting structure for a staircase region and spacer structures for the contact structures, according to some embodiments. FIG. 3B illustrates a section view along line A-A' of 3D memory device 300 shown in FIG. 3B, according to some embodiments. FIG. 3C illustrates a section view along line B-B' of 3D memory device 300 shown in FIG. 3B, according to some embodiments. For the ease of illustration, FIGS. 3A, 3B, and 3C are described together, and the details of the same structures in both 3D memory devices 100, 200, and 300 are not repeated for ease of description.

3D memory devices 300 have a supporting structure 360 overlaps and aligned with the staircase region of memory stack 106. As shown in FIG. 3C, 3D memory devices 300 have slit structures 330-1 with "H" cuts 105 (e.g., second slit structures) extending into supporting structure 360.

Different from supporting structures 160 and 260, instead of having multiple sub-supporting structures 160-1 and 260-1 divided by slit structures 130-1 with "H" cuts 105, supporting structures 360 within each memory block 103 may not be divided by slit structures 330-1 with "H" cuts 105 and may extend continuously along the y-direction. In other words, as illustrated in FIG. 3C, one memory block 103 corresponds to (e.g., overlaps and/or aligned with) one continuous supporting structure 360. Different from 3D memory devices 100 and 200, instead of extending into semiconductor layer 108, slit structures 330-1 with "H" cuts 105 extend into supporting structure 360. The material and the position of the upper and lower surface of supporting structure 360 may respectively be similar to or the same as those for supporting structure 360, and the detailed description is not repeated herein.

Although as shown in FIGS. 3A, 3B, and 3C, in 3D memory device 300, spacer structure 220 includes a well structure, it is understood that spacer structure 220 can have other suitable embodiments such as a trench structure, similar to or the same as spacer structure 120 as illustrated in FIGS. 1A, 1B, and 1C.

FIGS. 5A-5H illustrate a fabrication process for forming a 3D memory device, according to some embodiments of the present disclosure. FIG. 6 illustrates a flowchart of a method 600 for forming a 3D memory device, according to some embodiments of the present disclosure. Examples of the 3D memory device depicted in FIGS. 5A-5H and 6 include the 3D memory device depicted in FIGS. 1A-1C and 3A-3C. FIGS. 5A-5H and 6 will be described together. It is understood that the operations shown in method 600 are not exhaustive and that other operations can be performed as well before, after, or between any of the illustrated operations. Further, some of the operations may be performed simultaneously, or in a different order than shown in FIG. 6.

Referring to FIG. 6, method 600 starts at operations 602, in which a supporting structure opening and a spacer structure opening are simultaneously formed in a base structure, and a supporting structure and a spacer structure are formed in the supporting structure opening and the spacer structure opening respectively. FIGS. 5A-5D illustrate corresponding structures.

Figure 5A:
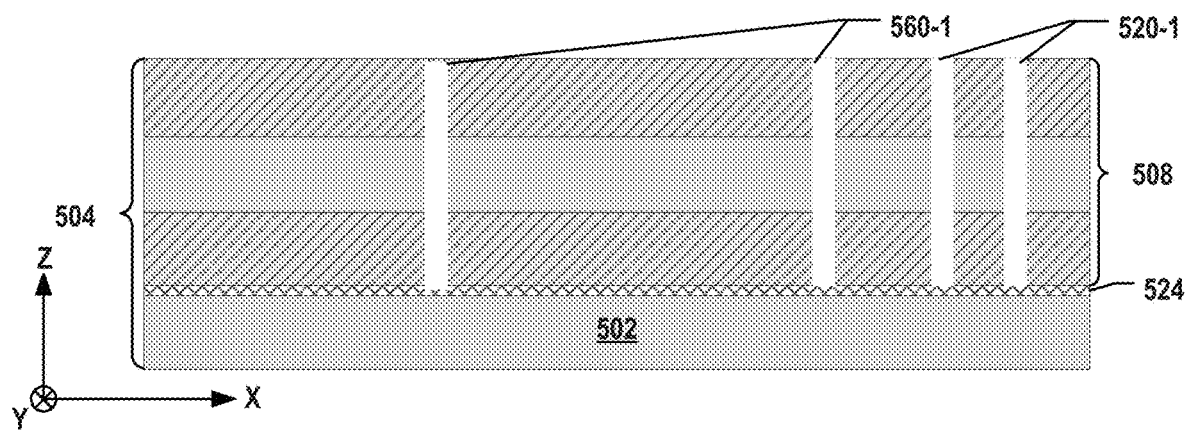
FIGS. 5A-5H illustrate an exemplary fabrication process for forming a 3D memory device, according to some embodiments of the present disclosure.
Figure 5B:
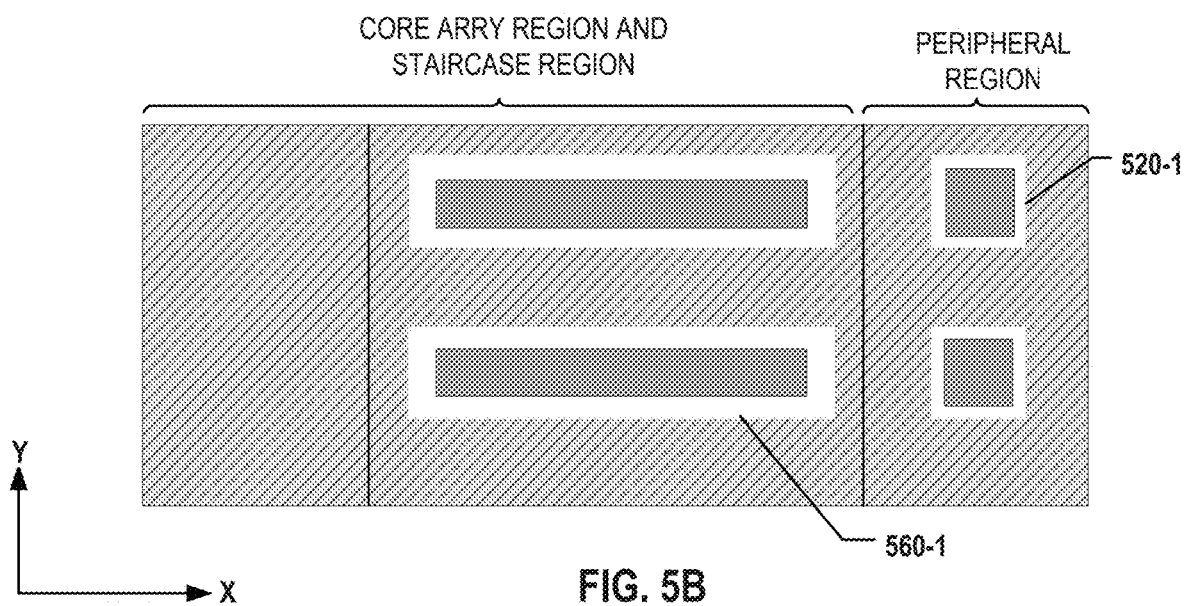
Figure 6:
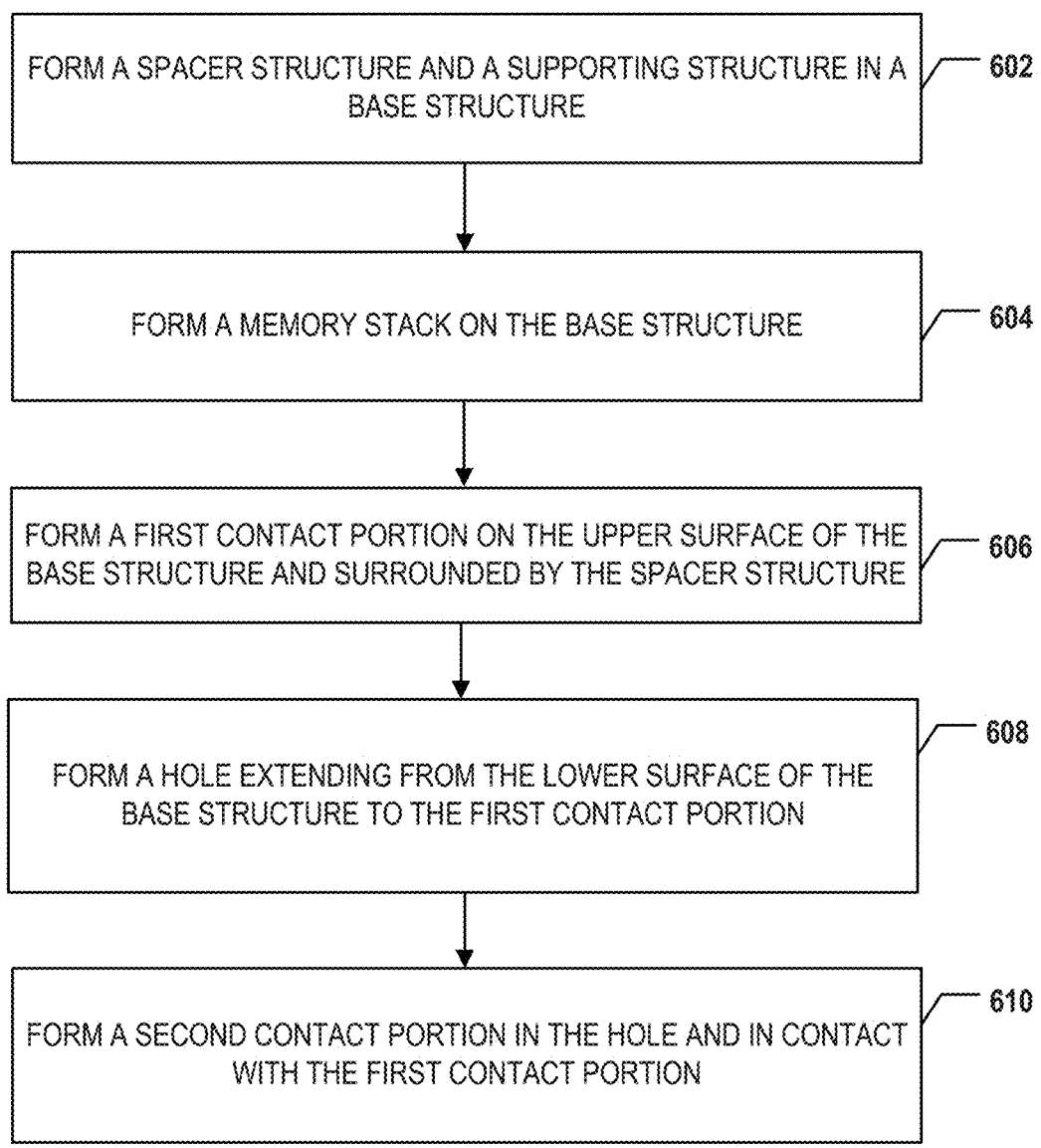
FIG. 6 illustrates a flowchart of a method for forming a 3D memory device, according to some embodiments of the present disclosure.

As shown in FIGS. 5A and 5B, at the beginning of the fabrication process, a supporting structure opening, and a spacer structure opening are simultaneously formed in a base structure 504. In some embodiments, the supporting structure opening and the spacer structure opening are formed by the same fabrication steps/operations. The shapes and depth of the trench structure may correspond to those of the subsequently-formed supporting structure and spacer structure. Base structure 504 may include an initial semiconductor layer 508 on a stop layer 524, which is further on an insulating layer 502. Initial semiconductor layer 508 may include a sacrificial sublayer, which can partially be replaced by a semiconductor sublayer 508-1 for forming semiconductor layer 508. The detailed description of initial semiconductor layer 508, semiconductor layer 508, stop layer 524, and insulating layer 502 may be referred to the description of the initial semiconductor layer, semiconductor layer 108, stop layer 124, and insulating layer 102, and is not repeated herein.

Base structure 504 may be formed on one side (e.g., the first side) of a substrate. The substrate can be a silicon substrate or a carrier substrate, made of any suitable materials, such as semiconductors, glass, sapphire, plastic, to name a few. In some embodiments, insulating layer 502 includes a dielectric material such as silicon oxide. In some embodiments, stop layer 524 includes a high-k dielectric material such as aluminum oxide. In some embodiments, later formed semiconductor layer 508 includes polysilicon having a uniform doping profile. In some embodiments, insulating layer 502, stop layer 524, and initial semiconductor layer 508 are sequentially formed on the substrate by any suitable film deposition methods such as chemical vapor deposition (CVD), physical vapor deposition (PVD), atomic layer deposition (ALD), electroplating, electroless deposition, and a combination thereof. Subsequently, the substrate may be removed or thinned for forming various structures such as contact vias. In some embodiments, the substrate is removed or thinned at a suitable time of the fabrication process such that contact vias can be formed from the lower surface of base structure 504.

The spacer structure opening may have a trench structure 520-1 enclosing an area in the peripheral region of base structure 504 (e.g., initial semiconductor layer 508) such that the enclosed area (e.g., in initial semiconductor layer 508) may be insulated from the portion of initial semiconductor layer 508 outside of trench structure 520-1. In some embodiments, trench structure 520-1 may extend from the upper surface of initial semiconductor layer 508 to at least the lower surface of initial semiconductor layer 508. For example, the lower surface of trench structure 520-1 may stop on or in stop layer 524. In some embodiments, the lower surface of initial semiconductor layer 508 stops at stop layer 524. A thickness/depth of trench structure 520-1 may at least be the thickness of initial semiconductor layer 508 along the z-direction. Trench structure 520-1 may be formed by any suitable patterning process such as dry etch and/or wet etch, following a photolithography process.

The supporting structure opening may have a trench structure 560-1 enclosing part of initial semiconductor layer 508 in the staircase region of base structure 504 (e.g., initial semiconductor layer 508) such that the sacrificial sublayer of the enclosed area (e.g., the part of initial semiconductor layer 508) may be protected from being replaced when semiconductor layer 508 is formed. In some embodiments, trench structure 560-1 may extend from the upper surface of initial semiconductor layer 508 to at least the lower surface of initial semiconductor layer 508. For example, the lower surface of trench structure 560-1 may stop on or in stop layer 524. In some embodiments, the lower surface of initial semiconductor layer 508 stops at stop layer 524. A thickness/depth of trench structure 560-1 may at least be the thickness of along the z-direction. Trench structure 560-1 of supporting structure 560 may be formed by the same patterning process as that of trench structure 520-1 of spacer structure 520. For example, the spacer structure opening and the supporting structure opening can be formed, in the peripheral region and the staircase region of the 3D memory device respectively and simultaneously, e.g., using the same etching process, by patterning base structure 504 (e.g., initial semiconductor layer 508) using a "zero mask," which is used for patterning base structure 504 before any structure is formed thereon.

Figure 5C:
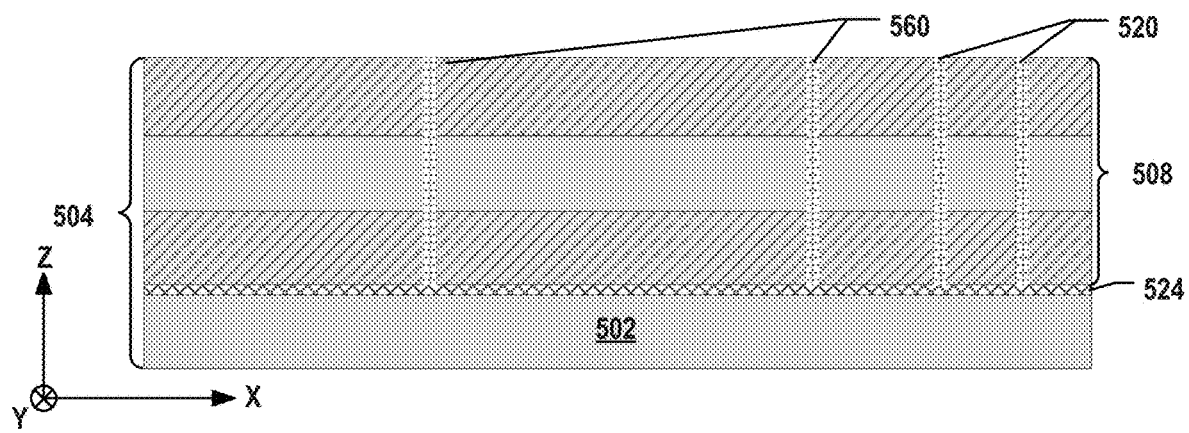
Figure 5D:
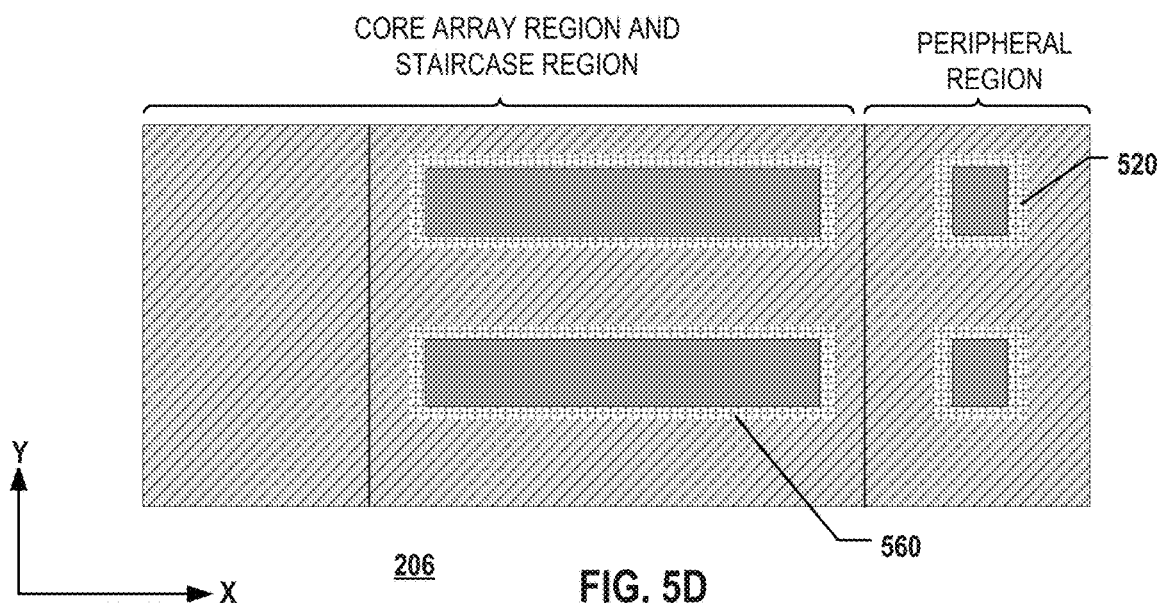

As shown in FIGS. 5C and 5D, a spacer structure 520 may be formed in the spacer structure opening. A dielectric material, e.g., silicon oxide and/or TEOS, can be deposited to fill trench structure 520-1 of the spacer structure opening, forming spacer structure 520. The dielectric material may be deposited by any suitable film deposition method such as CVD, PVD, ALD, and a combination thereof.

A supporting structure 560 (shown in FIGS. 5C and 5D) may be formed in the supporting structure opening. A material different from the material of initial semiconductor layer 508, e.g., a dielectric material such as silicon oxide and/or TEOS, can be deposited to fill trench structure 560-1 of the supporting structure opening, forming supporting structure 560. The filled material may be deposited by any suitable film deposition method such as CVD, PVD, ALD, and a combination thereof. In various embodiments, spacer structure 520 and supporting structures 560 can be formed by the same deposition process or separate deposition processes.

In some embodiments, to increase yield, the spacer structure opening and the supporting structure opening can both be filled with the same material in the same deposition process. For example, as illustrated in FIGS. 5C and 5D, the spacer structure opening and the supporting structure opening can both be filled with a dielectric material such as TEOS before a dielectric stack is formed on base structure 504.

Referring back to FIG. 6, method 600 proceeds to operation 604, in which a memory stack including a core array region and a staircase region is formed on the base structure.

Figure 5E:
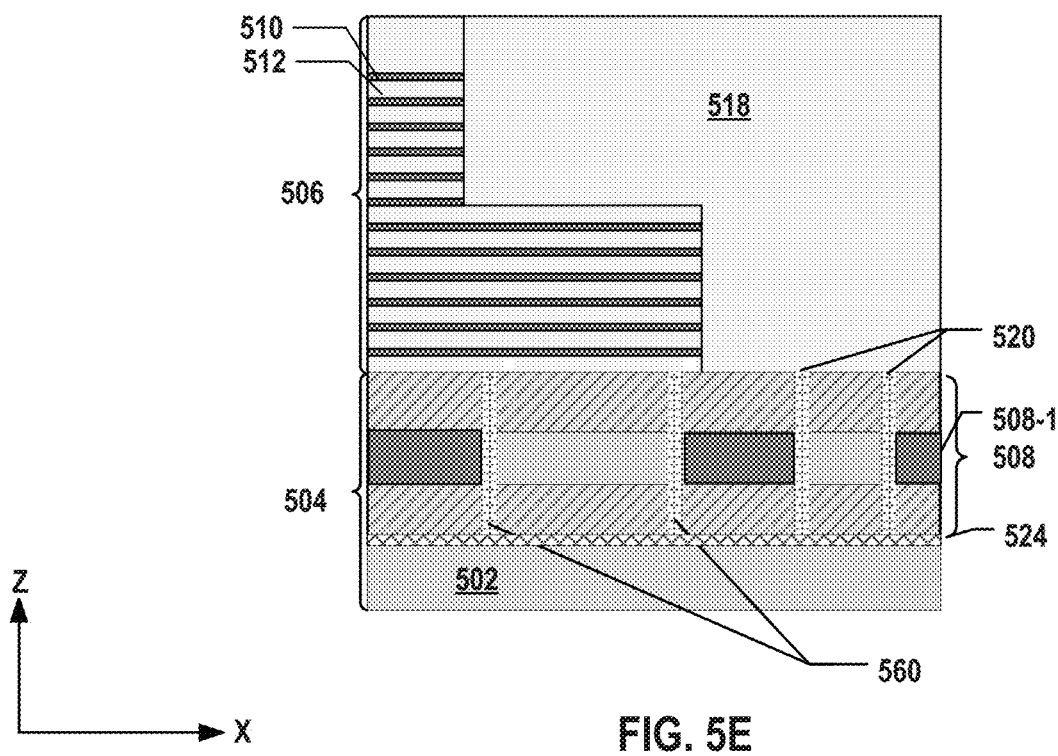

As illustrated in FIG. 5E, a dielectric stack, which subsequently forms the memory stack, can be formed on base structure 504 on the substrate. The dielectric stack can include a plurality of interleaved sacrificial layers and dielectric layers. In some embodiments, the dielectric stack, having a plurality pairs of a sacrificial layer and a dielectric layer, is formed on semiconductor layer 508 and supporting structure 560, the staircase region of which overlaps and is aligned with supporting structure 560. The interleaved sacrificial layers and dielectric layers can be alternatively deposited on semiconductor layer 508 and supporting structure 560 to form the dielectric stack. In some embodiments, each dielectric layer includes a layer of silicon oxide, and each sacrificial layer includes a layer of silicon nitride. In some embodiments, a pad oxide layer (e.g., silicon oxide layer, not shown) is formed between semiconductor layer 508 and/or supporting structure 560, and the dielectric stack. An insulating structure 518, having a suitable dielectric material such as silicon oxide, can be deposited over the dielectric stack and base structure 504 at a suitable time during the fabrication process, for example, after a staircase structure is formed (will be described below), such that the dielectric stack is located in insulating structure 518. The dielectric stack, insulating structure 518, and the pad oxide layer (if any) can be formed by one or more thin film deposition processes including, but not limited to, CVD, PVD, ALD, or any combination thereof.

Before the formation of the contact structure, other structures, although not shown in FIGS. 5A-5H, can be formed in the 3D memory device (e.g., the dielectric stack). In some embodiments, a channel structure extending vertically through the dielectric stack, semiconductor layer 508, and stopping at stop layer 524 is formed in the core array region of the dielectric stack. In some embodiments, to form the channel structure, a channel hole, e.g., an opening, extending vertically through the dielectric stack, and semiconductor layer 508, is formed, and a memory film (e.g., a blocking layer, a storage layer, and a tunneling layer) and a semiconductor channel are sequentially formed along a sidewall of the channel hole. The deposition of the films and layers in the channel hole may include ALD, CVD, PVD, any other suitable processes, or any combination thereof. In some embodiments, a channel plug is formed above and in contact with the semiconductor channel. In some embodiments, fabrication processes for forming the channel hole include wet etching and/or dry etching processes, such as deep-ion reactive etching (DRIE). The etching of the channel hole continues until being stopped by stop layer 524, due to the etching selectivity between the materials of stop layer 524 and semiconductor layer 508, according to some embodiments.

To conductively connect semiconductor layer 508 and the channel structure, a semiconductor sublayer 508-1, in contact with and conductively connected to the semiconductor channel, is formed in semiconductor layer 508. In some embodiments, a lower portion of the memory film is removed such that the memory film becomes disconnected. Semiconductor sublayer 508-1, in contact with the semiconductor channel, can be formed by replacing the sacrificial sublayer of initial semiconductor layer 508, not enclosed by supporting structure 560 nor by spacer structure 520. That is, the portions of sacrificial sublayer enclosed by supporting structure 560 and spacer structure 520 would stay intact during the replacement. The formation of semiconductor sublayer 508-1 may include suitable dry etch and/or wet etch processes, CVD, PVD, ALD, and a combination thereof. An insulating spacer, dividing the memory cells into a plurality of blocks, can also be formed. The formation of the insulating spacer may include suitable dry etch and/or wet etch processes, CVD, PVD, ALD, and a combination thereof.

In some embodiments, a slit structure is formed extending vertically through the dielectric stack, stopping in semiconductor layer 508 (e.g., in 3D memory device 100). For example, a slit opening extends vertically through the dielectric stack, into initial semiconductor layer 508, and exposes part of the sacrificial sublayer of initial semiconductor layer 508 may be formed. In some embodiments, fabrication processes for forming the slit opening include wet etching and/or dry etching, such as DRIE. In some embodiments, the slit opening extends further into the top portion of the sacrificial sublayer. The etching process through the dielectric stack may not stop at the top surface of the sacrificial sublayer and may continue to etch part of the sacrificial sublayer. The slit openings are formed between memory blocks 103, as shown in FIG. 1B (e.g., for forming first slit structures) and between memory fingers 107 (e.g., for forming second slit structures) according to some embodiments. In some embodiments, the slit structure can be formed by depositing dielectrics into the slit opening using one or more thin film deposition processes, such as ALD, CVD, PVD, any other suitable processes, or any combination thereof. It is understood that although not shown, in some examples, the slit structure may be formed by depositing dielectrics (as a spacer) and conductive materials (as a contact) into the slit opening. As described above along with FIGS. 1B and 1C, the second slit structures (e.g., the slit structures between memory fingers 107) divide supporting structure 560 into multiple sub-supporting structures, each corresponding (e.g., overlaps and/or aligned with) to a memory finger divided by the second slit structures.

A gate replacement process can be performed to replace the sacrificial layers in the dielectric stack to form a plurality of conductor layers. In some embodiments, the gate replacement process is performed after the slit structures are formed and through the slit structures. A memory stack 506, having a plurality of interleaved conductor layers 510 and dielectric layers 512, can be formed on semiconductor layer 508. The gate replacement process may include a suitable isotropic etching process, CVD, PVD, ALD, and a combination thereof. The channel structures, extending through memory stack 506, may be in contact with and conductively connected to semiconductor layer 508 through the semiconductor channel. In some embodiments, memory stack 506 may be repetitively patterned to form a staircase structure in the staircase region, which includes a plurality of stairs extending laterally (e.g., along the x/y-direction). The patterning process of memory stack 506 may include repetitive photolithography processes and recess etches (e.g., an isotropic etching process).

Figure 5F:
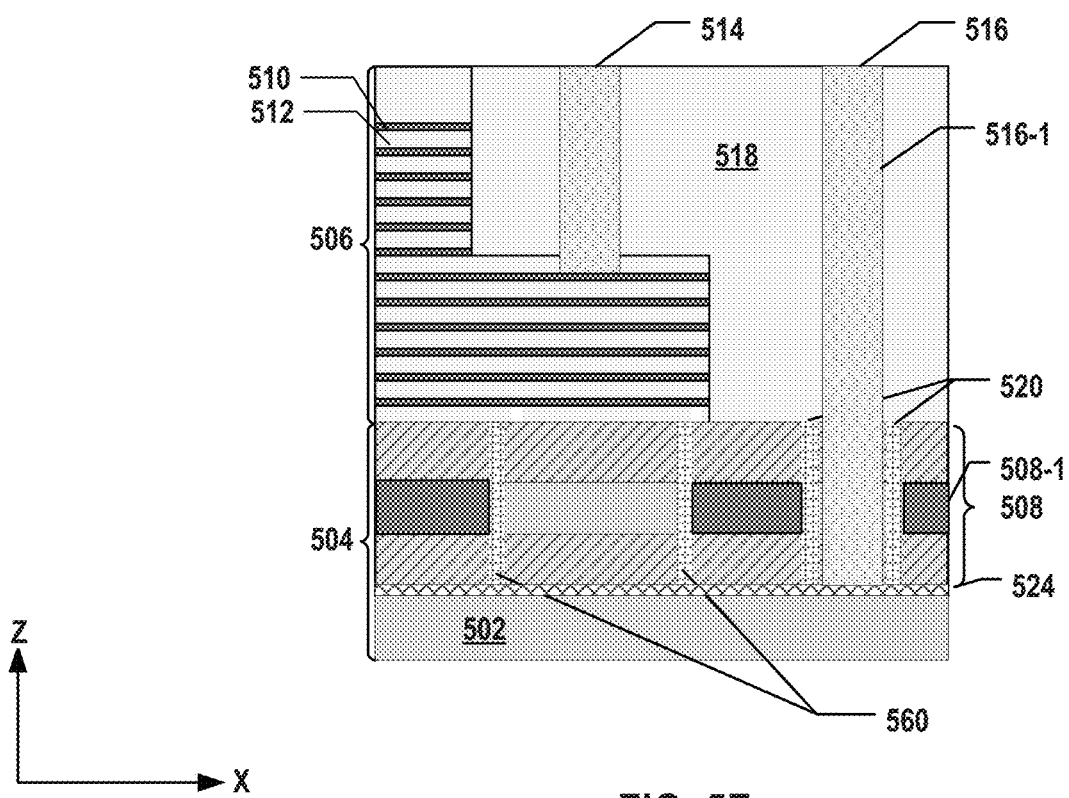

Referring back to FIG. 6, method 600 proceeds to operation 606, in which a first contact portion is formed on the upper surface of the base structure and is surrounded by the trench structure of the spacer structure. FIG. 5F illustrates a corresponding structure.

As shown in FIG. 5F, a first contact portion 516-1 may be formed in spacer structure 520. First contact portion 516-1 may be formed in insulating structure 518 and landed on the lower surface of spacer structure 520. First contact portion 516-1 may be surrounded by spacer structure 520 and in contact with the part of semiconductor layer 508 enclosed by spacer structure 520. That said, the lateral dimensions of first contact portion 516-1 may be less than the lateral dimensions of the area enclosed by spacer structure 520 (or the filled trench structure 520-1). First contact portion 516-1 is therefore isolated from semiconductor layer 508 outside of spacer structure 520. In some embodiments, first contact portion 516-1 is formed by the same process that forms a word line contact 514, which lands on a respective stair to form a conductive connection with conductor layer 510 in the stair. First contact portion 516-1 and word line contact 514 may each include a suitable conductive material such as tungsten. In some embodiments, the lower surface of first contact portion 516-1 does not reach the lower surface of spacer structure 520 but is below the upper surface of semiconductor layer 508 such that the etching from the lower surface of base structure 504 can be reduced when the second contact portion is being formed. That is, the hole to form the second contact portion does not need to reach the upper surface of semiconductor layer 508 from the lower surface of base structure 504, i.e., insulating layer 502.

The formation of first contact portion 516-1 and word line contact 514 may include a patterning process followed by a suitable film deposition process. The patterning process may remove portions of insulating structure 518 to form openings, at desired depths, that correspond to the locations and positions of first contact portion 516-1 and word line contact 514. In some embodiments, the opening for first contact portion 516-1 extends in insulating structure 518 and exposes the enclosed semiconductor layer 508 in trench structure 520-1. In some embodiments, the opening for word line contact 514 extends in insulating structure 518 and exposes conductor layer 510 in the corresponding stair. The deposition of the conductive material may include CVD, PVD, ALD, electroplating, electroless plating, and a combination thereof.

Figure 5G:
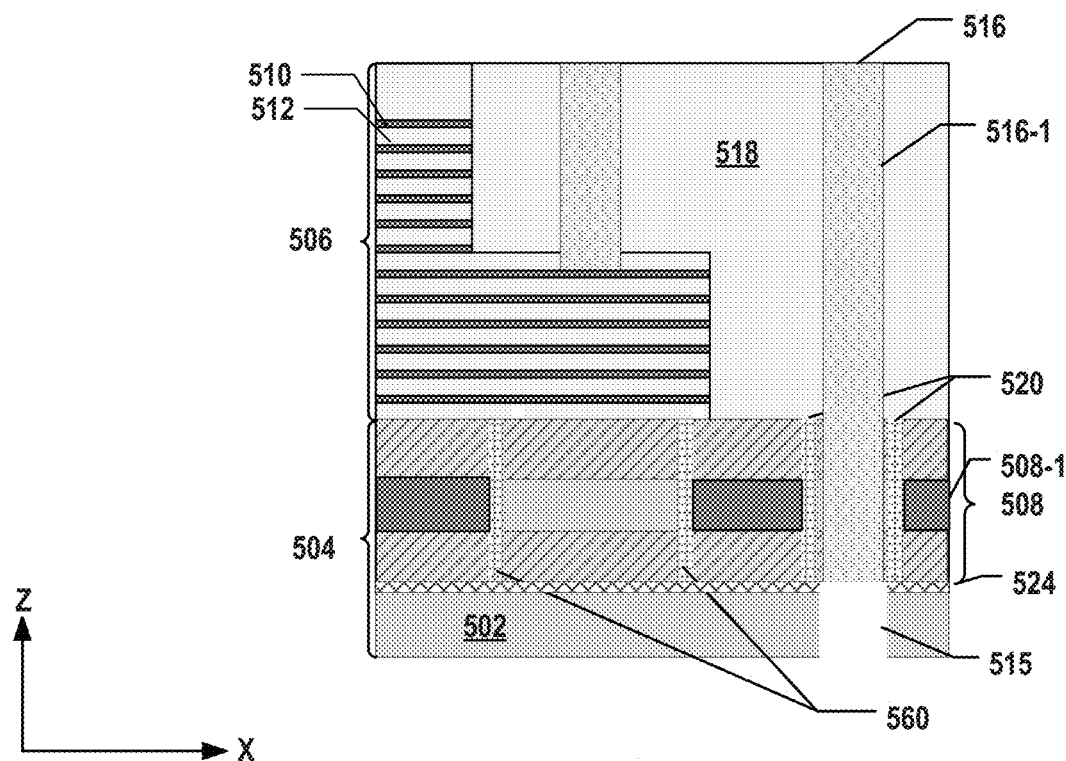

Referring back to FIG. 6, method 600 proceeds to operation 608, in which a hole is formed extending from the lower surface of the base structure to the first contact portion. FIG. 5G illustrates a corresponding structure.

As shown in FIG. 5G, a hole 515 may be formed extending from the lower surface of base structure 504 to first contact portion 516-1. A portion of base structure 504, i.e., a portion of insulating layer 502, stop layer 524, and semiconductor layer 508 enclosed by trench structure 520-1 (if any), may be removed to form hole 515, which extends from the lower surface of base structure 504, e.g., the lower surface of insulating layer 502, to first contact portion 516-1. Hole 515 may be in contact with and exposing first contact portion 516-1. In various embodiments, the upper surface of hole 515 may be coplanar with or above the upper surface of stop layer 524 to ensure sufficient contact between first contact portion 516-1 and hole 515 (or subsequently-formed second contact portion). As shown in FIG. 5G, the lateral dimensions of a hole 515 may be sufficiently large to fully contact first contact portion 516-1 and may be sufficiently small to not laterally pass trench structure 520-1. In some embodiments, the lateral dimensions of hole 515 may be less than or equal to the lateral dimensions of trench structure 520-1 (or spacer structure 520). In some embodiments, another hole (not shown), for forming a source contact structure, may be formed in base structure 504 in the same patterning process that forms a hole 515. The patterning process may include a suitable etching process, e.g., dry etch and/or wet etch processes.

Figure 5H:
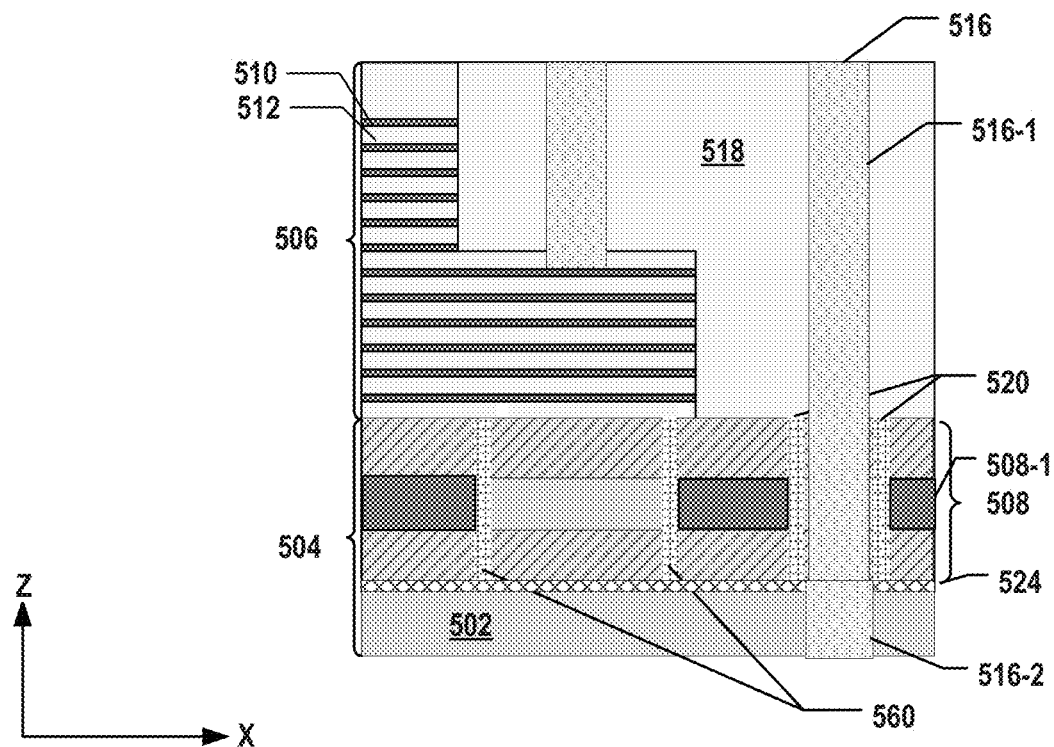

Referring back to FIG. 6, method 600 proceeds to operation 610, in which a second contact portion is formed in the hole and in contact with the first contact portion. FIG. 5H illustrates a corresponding structure.

As shown in FIG. 5H, a second contact portion 516-2 may be formed in hole 515, in contact with first contact portion 516-1. A conductive material, such as tungsten, can be deposited to fill in hole 515 and the other hole for forming the source contact structure. Any suitable film deposition method can be performed to deposit the conductive material. For example, the deposition method may include CVD, PVD, ALD, electroplating, electroless plating, or a combination thereof. In some embodiments, a source contact structure may be formed by the same deposition process that forms second contact portion 516-2. A contact structure 516, having first and second contact portions 516-1 and 516-2 in contact with each other, may be formed extending through insulating structure 518 and base structure 504 (e.g., spacer structure 520), connecting peripheral circuits of the 3D memory device. A lower surface of first contact portion 516-1 may be below the upper surface of semiconductor layer 508. The upper surface of second contact portion 516-2 may be a flat/leveled surface.

FIGS. 7A-7H illustrate a fabrication process for forming another 3D memory device, according to some embodiments of the present disclosure. FIG. 8 illustrates a flowchart of a method 800 for forming the 3D memory device, according to some embodiments of the present disclosure. Examples of the 3D memory device depicted in FIGS. 7A-7H and 8 include the 3D memory device depicted in FIGS. 2A-2C and 3A-3C. FIGS. 7A-7H and 8 will be described together. It is understood that the operations shown in method 800 are not exhaustive and that other operations can be performed as well before, after, or between any of the illustrated operations. Further, some of the operations may be performed simultaneously, or in a different order than shown in FIG. 8.

Referring to FIG. 8, method 800 starts at operations 802, in which a supporting structure opening and a spacer structure opening are simultaneously formed in a base structure, and a supporting structure and a spacer structure are formed in the supporting structure opening and the spacer structure opening respectively. FIGS. 7A-7D illustrate corresponding structures.

Figure 7A:
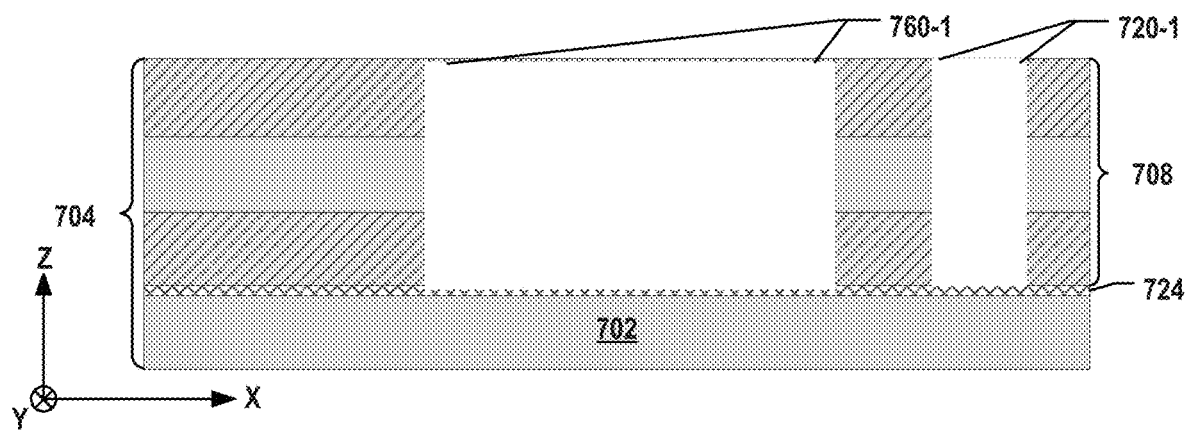
FIGS. 7A-7H illustrate an exemplary fabrication process for forming a 3D memory device, according to some embodiments of the present disclosure.
Figure 7B:
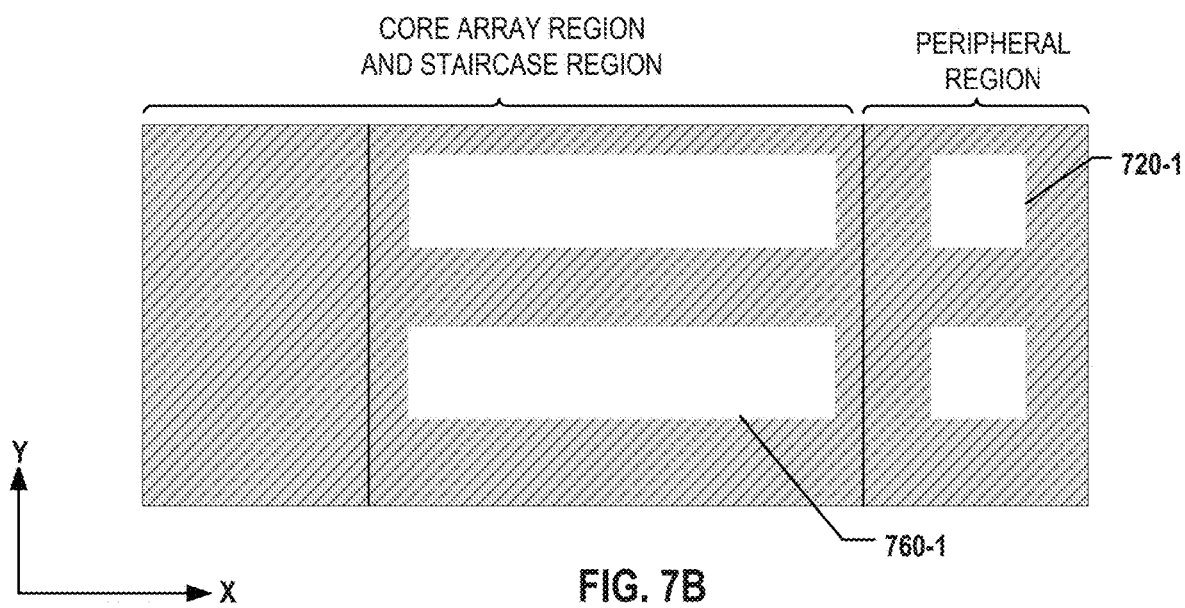
Figure 8:
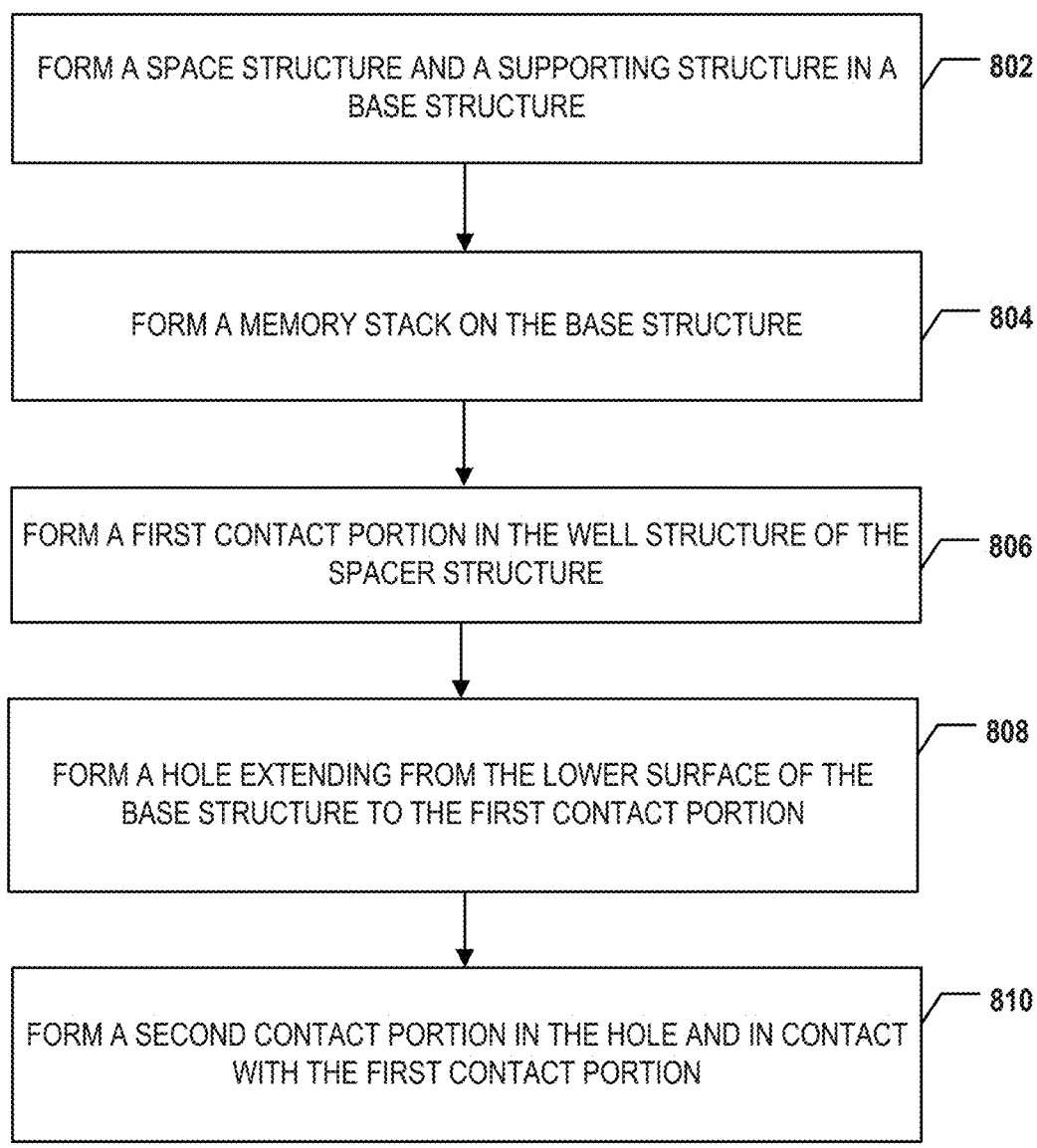
FIG. 8 illustrates a flowchart of a method for forming a 3D memory device, according to some embodiments of the present disclosure.

As shown in FIGS. 7A and 7B, at the beginning of the fabrication process, a supporting structure opening, and a spacer structure opening are simultaneously formed in a base structure 704. In some embodiments, the supporting structure opening and the spacer structure opening are formed by the same fabrication steps/operations. The shapes and depth of the trench structure may correspond to those of the subsequently-formed supporting structure and spacer structure. Base structure 704 may include an initial semiconductor layer 708 on a stop layer 724, which is further on an insulating layer 702. Initial semiconductor layer 708 may include a sacrificial sublayer, which can partially be replaced by a semiconductor sublayer 708-1 for forming semiconductor layer 708. The detailed description of initial semiconductor layer 708, semiconductor layer 708, stop layer 724, and insulating layer 702 may be referred to the description of the initial semiconductor layer, semiconductor layer 108, stop layer 124, and insulating layer 102, and is not repeated herein.

Base structure 704 may be formed on one side (e.g., the first side) of a substrate. The substrate can be a silicon substrate or a carrier substrate, made of any suitable materials, such as semiconductors, glass, sapphire, plastic, to name a few. In some embodiments, insulating layer 702 includes a dielectric material such as silicon oxide. In some embodiments, stop layer 724 includes a high-k dielectric material such as aluminum oxide. In some embodiments, the later formed semiconductor layer 708 includes polysilicon having a uniform doping profile. In some embodiments, insulating layer 702, stop layer 724, and semiconductor layer 708 are sequentially formed on the substrate by any suitable film deposition methods such as chemical vapor deposition (CVD), physical vapor deposition (PVD), atomic layer deposition (ALD), electroplating, electroless deposition, and a combination thereof. Subsequently, the substrate may be removed or thinned for forming various structures such as contact vias. In some embodiments, the substrate is removed or thinned at a suitable time of the fabrication process such that contact vias can be formed from the lower surface of base structure 704.

The spacer structure opening may have a hole 720-1 in the peripheral region of base structure 704 (e.g., initial semiconductor layer 708). Different from trench structure 520-1, hole 720-1 takes up the entire area enclosed by spacer structure 720 such that the enclosed area when later be filled with a dielectric material, may be insulated from semiconductor layer 708. In some embodiments, hole 720-1 may extend from the upper surface of semiconductor layer 708 to at least the lower surface of initial semiconductor layer 708. For example, the lower surface of hole 720-1 may stop on or in stop layer 724. In some embodiments, the lower surface of initial semiconductor layer 708 stops at stop layer 724. The depth of hole 720-1 may at least be the thickness of initial semiconductor layer 708 along the z-direction. Hole 720-1 of spacer structure 720 may be formed by any suitable patterning process such as dry etch and/or wet etch, following a photolithography process.

The supporting structure opening may have a hole 760-1 in the peripheral region of base structure 704 (e.g., initial semiconductor layer 708). Different from trench structure 560-1, hole 760-1 takes up the entire area enclosed by spacer structure 720 such that the enclosed area when later be filled with a material that is different from the material of initial semiconductor layer 708, may not be etched when semiconductor layer 708 is formed. In some embodiments, hole 760-1 may extend from the upper surface of initial semiconductor layer 708 to at least the lower surface of initial semiconductor layer 708. For example, the lower surface of hole 760-1 may stop on or in stop layer 724. In some embodiments, the lower surface of initial semiconductor layer 708 stops at stop layer 724. The depth of hole 760-1 may at least be the thickness of semiconductor layer 708 along the z-direction. Hole 760-1 of supporting structure 760 may be formed by the same patterning process as the that of hole 720-1 of spacer structure 720. For example, the spacer structure opening and the supporting structure opening can be formed, in the peripheral region and the staircase region of the 3D memory device respectively and simultaneously, e.g., using the same etching process, by patterning base structure 704 (e.g., semiconductor layer 708) using a "zero mask," which is used for patterning base structure 704 before any structure is formed thereon.

Figure 7C:
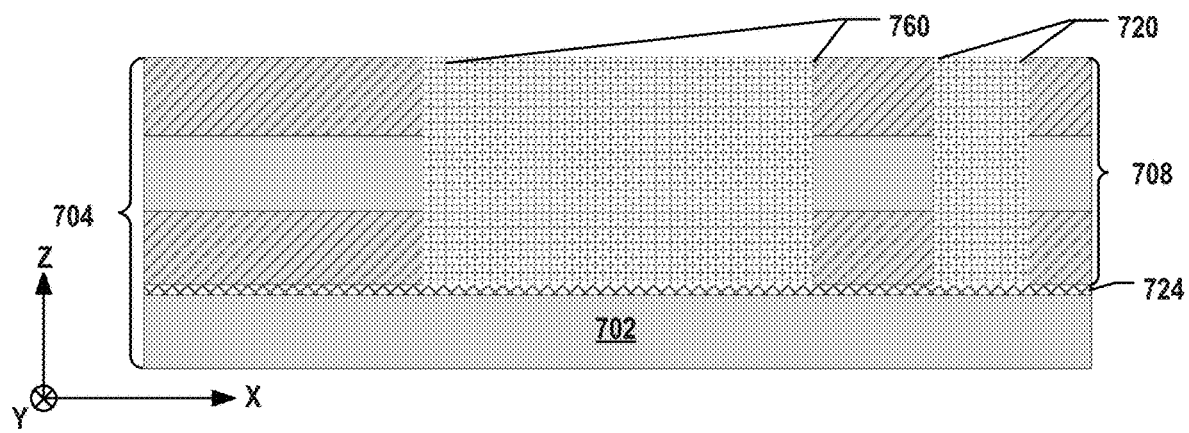
Figure 7D:
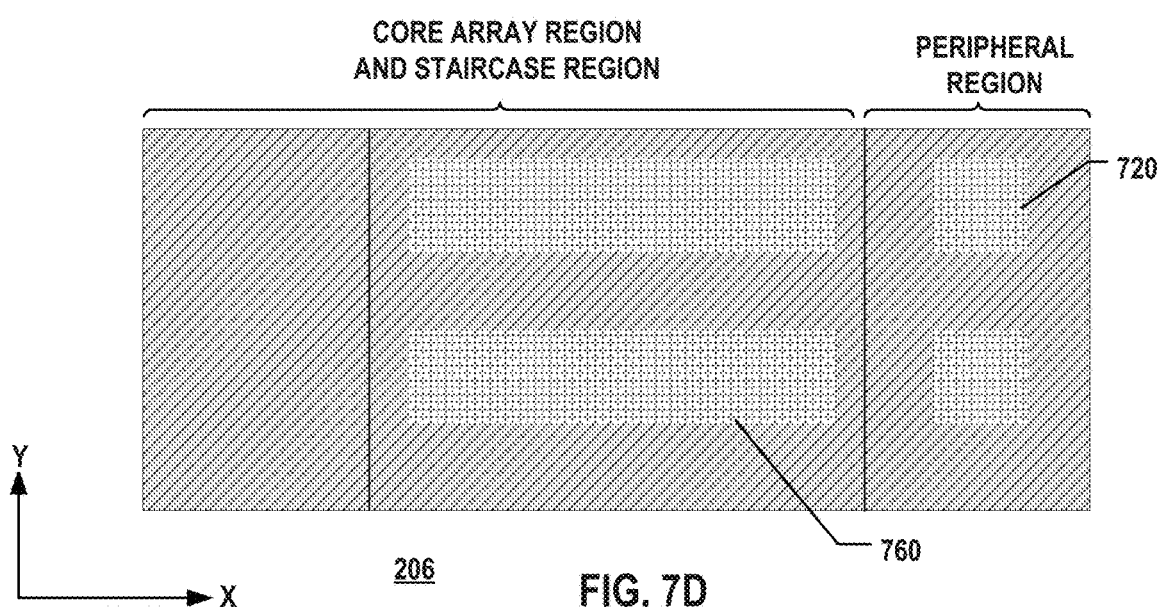

As shown in FIGS. 7C and 7D, spacer structure 720 may be formed in the spacer structure opening for forming a well structure (e.g., spacer structure 720). A dielectric material, e.g., silicon oxide and/or TEOS, can be deposited to fill hole 720-1 of the spacer structure opening, forming spacer structure 720. The dielectric material may be deposited by any suitable film deposition method such as CVD, PVD, ALD, and a combination thereof.

A supporting structure 760 (shown in FIGS. 7C and 7D) may be formed in the supporting structure opening for forming a well structure (e.g., supporting structure 760). A material different from the material of semiconductor layer 708, e.g., an insulating material such as silicon oxide and/or TEOS, can be deposited to fill hole 760-1 of the supporting structure opening, forming supporting structure 760. The filled material may be deposited by any suitable film deposition method such as CVD, PVD, ALD, and a combination thereof. In various embodiments, spacer structure 720 and supporting structure 760 can be formed by the same deposition process or separate deposition processes.

In some embodiments, to increase yield, the spacer structure opening and the supporting structure opening can both be filled with the same material in the same deposition process. For example, as illustrated in FIGS. 7C and 7D, the spacer structure opening and the supporting structure opening can both be filled with a dielectric material such as TEOS in the same deposition process before forming a dielectric stack is formed on base structure 704.

Referring back to FIG. 8, method 800 proceeds to operation 804, in which a memory stack including a core array region and a staircase region is formed on the base structure.

Figure 7E:
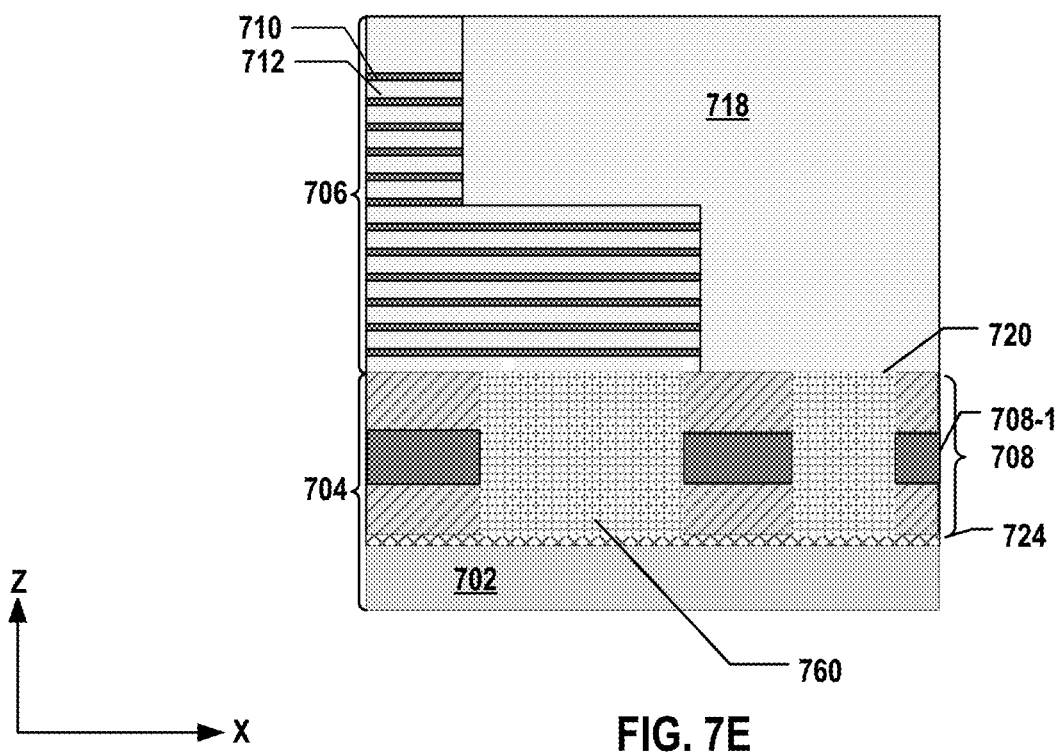

As illustrated in FIG. 7E, a dielectric stack, which subsequently forms the memory stack, can be formed on base structure 704 on the substrate. The dielectric stack can include a plurality of interleaved sacrificial layers and dielectric layers. In some embodiments, the dielectric stack, having a plurality pairs of a sacrificial layer and a dielectric layer, is formed on semiconductor layer 708 and supporting structure 760, the staircase region of which overlaps and is aligned with supporting structure 760. The interleaved sacrificial layers and dielectric layers can be alternatively deposited on semiconductor layer 708 and supporting structure 760 to form the dielectric stack. In some embodiments, each dielectric layer includes a layer of silicon oxide, and each sacrificial layer includes a layer of silicon nitride. In some embodiments, a pad oxide layer (e.g., silicon oxide layer, not shown) is formed between semiconductor layer 708 and/or supporting structure 760, and the dielectric stack. An insulating structure 718, having a suitable dielectric material such as silicon oxide, can be deposited over the dielectric stack and base structure 704 at a suitable time during the fabrication process, for example, after a staircase structure is formed (will be described below), such that the dielectric stack is located in insulating structure 718. The dielectric stack, insulating structure 718, and the pad oxide layer (if any) can be formed by one or more thin film deposition processes including, but not limited to, CVD, PVD, ALD, or any combination thereof.

Before the formation of the contact structure, other structures, although not shown in FIGS. 7A-7H, can be formed in the 3D memory device (e.g., the dielectric stack). In some embodiments, a channel structure extending vertically through the dielectric stack, semiconductor layer 708, and stopping at stop layer 724 is formed in the core array region of the dielectric stack. In some embodiments, to form the channel structure, a channel hole, e.g., an opening, extending vertically through the dielectric stack, and semiconductor layer 708, is formed, and a memory film (e.g., a blocking layer, a storage layer, and a tunneling layer) and a semiconductor channel are sequentially formed along a sidewall of the channel hole. The deposition of the films and layers in the channel hole may include ALD, CVD, PVD, any other suitable processes, or any combination thereof. In some embodiments, a channel plug is formed above and in contact with the semiconductor channel. In some embodiments, fabrication processes for forming the channel hole include wet etching and/or dry etching processes, such as deep-ion reactive etching (DRIE). The etching of the channel hole continues until being stopped by stop layer 724, due to the etching selectivity between the materials of stop layer 724 and semiconductor layer 708, according to some embodiments.

To conductively connect semiconductor layer 708 and the channel structure, a semiconductor sublayer 708-1, in contact with and conductively connected to the semiconductor channel, is formed in semiconductor layer 708. In some embodiments, a lower portion of the memory film is removed such that the memory film becomes disconnected. Semiconductor sublayer 708-1, in contact with the semiconductor channel, can be formed by replacing the sacrificial sublayer of initial semiconductor layer 708. The formation of semiconductor sublayer 708-1 may include suitable dry etch and/or wet etch processes, CVD, PVD, ALD, and a combination thereof. An insulating spacer, dividing the memory cells into a plurality of blocks, can also be formed. The formation of the insulating spacer may include suitable dry etch and/or wet etch processes, CVD, PVD, ALD, and a combination thereof.

In some embodiments, a slit structure is formed extending vertically through the dielectric stack, stopping in semiconductor layer 708 (e.g., in 3D memory device 200). For example, a slit opening extends vertically through the dielectric stack, into initial semiconductor layer 708, and exposes part of the sacrificial sublayer of initial semiconductor layer 708 may be formed. In some embodiments, fabrication processes for forming the slit opening include wet etching and/or dry etching, such as DRIE. In some embodiments, the slit opening extends further into the top portion of the sacrificial sublayer. The etching process through the dielectric stack may not stop at the top surface of the sacrificial sublayer and may continue to etch part of the sacrificial sublayer. The slit openings are formed between memory blocks 103, as shown in FIG. 2B (e.g., for forming first slit structures) and between memory fingers 107 (e.g., for forming second slit structures) according to some embodiments. In some embodiments, the slit structure can be formed by depositing dielectrics into the slit opening using one or more thin film deposition processes, such as ALD, CVD, PVD, any other suitable processes, or any combination thereof. It is understood that although not shown, in some examples, the slit structure may be formed by depositing dielectrics (as a spacer) and conductive materials (as a contact) into the slit opening. As described above along with FIGS. 2B and 2C, the second slit structures (e.g., the slit structures between memory fingers 206) divide supporting structure 760 into multiple sub-supporting structures, each corresponding to (e.g., overlaps and/or aligned with) a memory finger divided by the second slit structures.

In some other embodiments, a slit structure is formed extending vertically through the dielectric stack, stopping in semiconductor layer 708 or in supporting structure 760 (e.g., in 3D memory device 300). For example, at least one slit opening (e.g., a first slit opening) extending vertically through the dielectric stack, into initial semiconductor layer 708, and exposing part of the sacrificial sublayer of initial semiconductor layer 708 may be formed, and at least one slit opening (e.g., a second slit opening) extending vertically through the dielectric stack, into supporting structure 760, and exposing part of the well structure of supporting structure 760 may be formed as well. In some embodiments, fabrication processes for forming the slit opening include wet etching and/or dry etching, such as DRIE. In some embodiments, the first and second slit openings extend further into the top portion of the sacrificial sublayer and the well structure of supporting structure 760, respectively. The etching process through the dielectric stack may not stop at the top surface of the sacrificial sublayer and the well structure of supporting structure 760, and may continue to etch part of the sacrificial sublayer and the well structure of supporting structure 760 respectively. The first slit openings are formed between memory blocks 103, as shown in FIG. 3B (e.g., for forming first slit structures) and the second slit openings are formed between memory fingers 107 (e.g., for forming second slit structures) according to some embodiments. In some embodiments, the slit structure can be formed by depositing dielectrics into the slit opening using one or more thin film deposition processes, such as ALD, CVD, PVD, any other suitable processes, or any combination thereof. It is understood that although not shown, in some examples, the slit structure may be formed by depositing dielectrics (as a spacer) and conductive materials (as a contact) into the slit opening. As described above along with FIGS. 3B and 3C, the second slit structures (e.g., the slit structures between memory fingers 107) does not divide supporting structures into multiple sub-supporting structures, and one memory block corresponds to (e.g., overlaps and/or aligned with) a consecutive supporting structure 560 with no sub-supporting structures in between.

A gate replacement process can be performed to replace the sacrificial layers in the dielectric stack to form a plurality of conductor layers. In some embodiments, the gate replacement process is performed after the slit structures are formed and through the slit structures. A memory stack 706, having a plurality of interleaved conductor layers 710 and dielectric layers 712, can be formed on semiconductor layer 708. The gate replacement process may include a suitable isotropic etching process, CVD, PVD, ALD, and a combination thereof. The channel structures, extending through memory stack 706, may be in contact with and conductively connected to semiconductor layer 708 through the semiconductor channel. In some embodiments, memory stack 706 may be repetitively patterned to form a staircase structure in the staircase region, which includes a plurality of stairs extending laterally (e.g., along the x/y-direction). The patterning process of memory stack 706 may include repetitive photolithography processes and recess etches (e.g., an isotropic etching process).

Figure 7F:
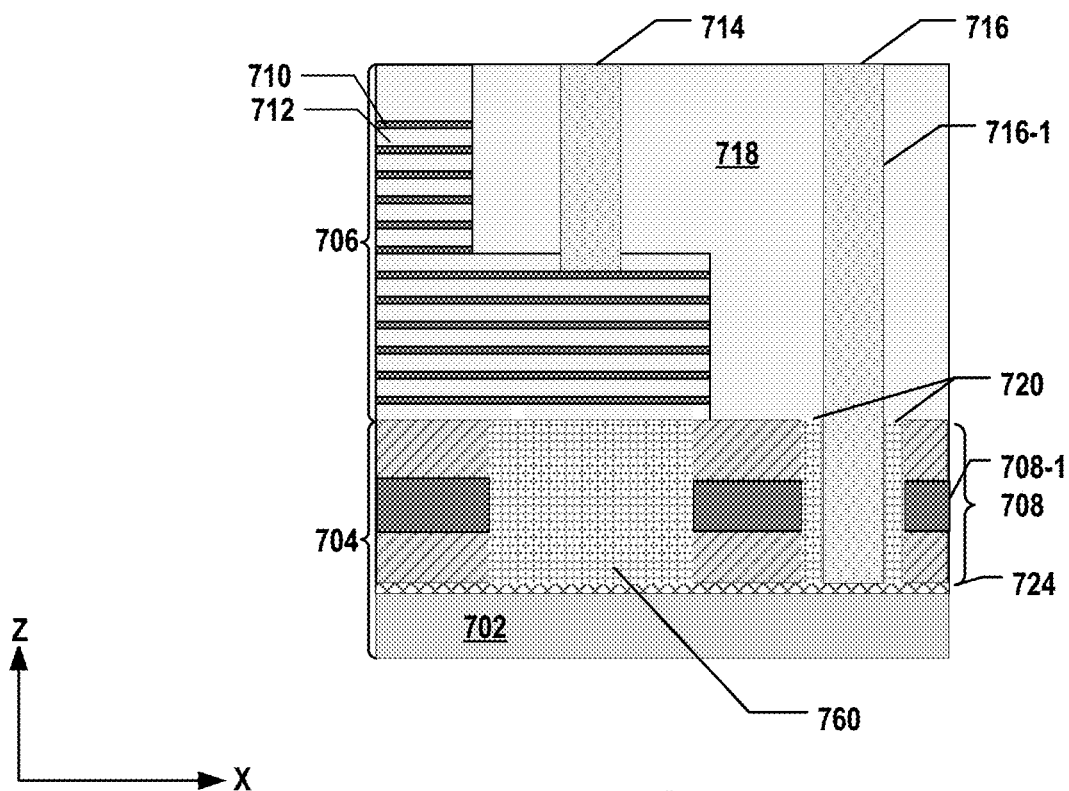

Referring back to FIG. 8, method 800 proceeds to operation 806, in which a first contact portion is formed in the well structure of the spacer structure. FIG. 7F illustrates a corresponding structure.

As shown in FIG. 7F, a first contact portion 716-1 may be surrounded and in contact with the well structure (e.g., hole 720-1 filled with dielectric material) of spacer structure 720. In other words, a diameter of first contact portion 716-1 is smaller than a diameter of the well structure of spacer structure 720 in a plan view (e.g., in the x-y plane), such that first contact portion 716-1 may be insulated from semiconductor layer 708 by spacer structure 720 (e.g., by the well structure of spacer structure 720). It is understood that first contact portion 716-1 and the well structure of spacer structure 720 may be of any suitable shapes such as oval, squared, rectangular, and circular shapes. In some embodiments, the well structure of spacer structure 720 and first contact portion 716-1 may have the same shape or different shapes in the plan view.

First contact portion 716-1 may be formed in insulating structure 718 and landed on the lower surface of the well structure of spacer structure 720. First contact portion 716-1 may be surrounded by and in contact with the well structure of spacer structure 720. First contact portion 716-1 is therefore isolated from semiconductor layer 708 outside of spacer structure 720. In some embodiments, first contact portion 716-1 is formed by the same process that forms a word line contact 714, which lands on a respective stair to form a conductive connection with conductor layer 710 in the stair. First contact portion 716-1 and word line contact 714 may each include a suitable conductive material such as tungsten. In some embodiments, the lower surface of first contact portion 716-1 does not reach the lower surface of the well structure of spacer structure 720 but is below the upper surface of semiconductor layer 708 such that the etching from the lower surface of base structure 704 can be reduced when the second contact portion is being formed. That is, the hole to form the second contact portion does not need to reach the upper surface of semiconductor layer 708 from the lower surface of base structure 704, i.e., insulating layer 702.

The formation of first contact portion 716-1 and word line contact 714 may include a patterning process followed by a suitable film deposition process. The patterning process may remove portions of insulating structure 718 to form openings, at desired depths, that correspond to the locations and positions of first contact portion 716-1 and word line contact 714. In some embodiments, the opening for first contact portion 716-1 extends in insulating structure 718 and exposes the well structure of spacer structure 720. In some embodiments, the opening for word line contact 714 extends in insulating structure 718 and exposes conductor layer 710 in the corresponding stair. The deposition of the conductive material may include CVD, PVD, ALD, electroplating, electroless plating, and a combination thereof.

Figure 7G:
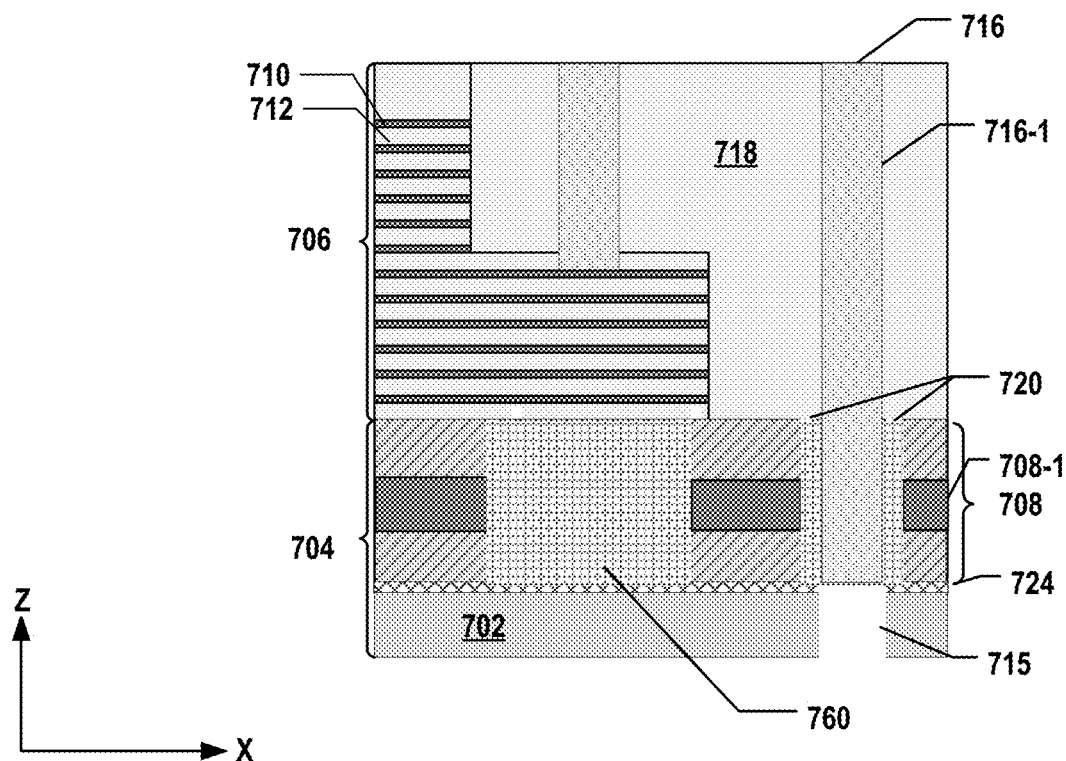

Referring back to FIG. 8, method 800 proceeds to operation 808, in which a hole is formed extending from the lower surface of the base structure to the first contact portion. FIG. 7G illustrates a corresponding structure.

As shown in FIG. 7G, a hole 715 may be formed extending from the lower surface of base structure 704 to first contact portion 716-1. A portion of base structure 704, i.e., a portion of insulating layer 702, stop layer 724, and the well structure of spacer structure 720 (if any), may be removed to form hole 715, which extends from the lower surface of base structure 704, e.g., the lower surface of insulating layer 702, to first contact portion 716-1. Hole 715 may be in contact with and exposing first contact portion 716-1. In various embodiments, the upper surface of hole 715 may be coplanar with or above the upper surface of stop layer 724 to ensure sufficient contact between first contact portion 716 and hole 715 (or subsequently-formed second contact portion). As shown in FIG. 7G, the lateral dimensions of a hole 715 may be sufficiently large to fully contact first contact portion 716-1 and may be sufficiently small to not laterally pass the well structure of spacer structure 720. In some embodiments, the lateral dimensions of hole 715 may be less than or equal to the lateral dimensions of the well structure of spacer structure 720 (or spacer structure 720). In some embodiments, another hole (not shown), for forming a source contact structure, may be formed in base structure 704 in the same patterning process that forms a hole 715. The patterning process may include a suitable etching process, e.g., dry etch and/or wet etch processes.

Figure 7H:
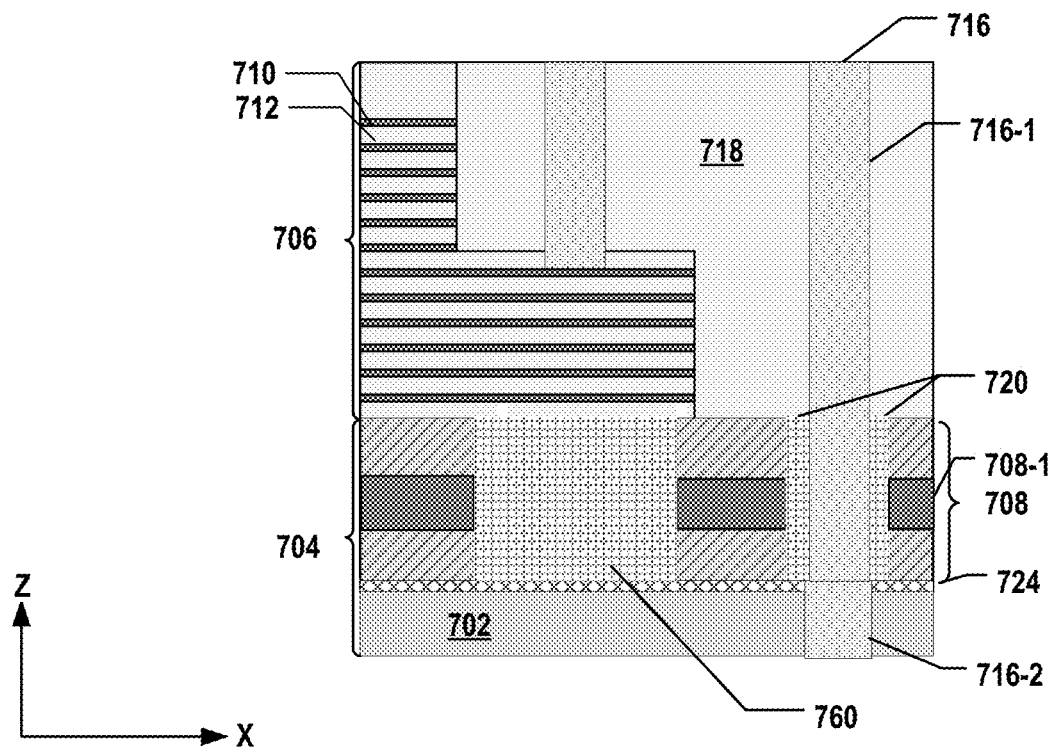

Referring back to FIG. 8, method 800 proceeds to operation 810, in which a second contact portion is formed in the hole and in contact with the first contact portion. FIG. 7H illustrates a corresponding structure.

As shown in FIG. 7H, a second contact portion 716-2 may be formed in hole 715, in contact with first contact portion 716-1. A conductive material, such as tungsten, can be deposited to fill in hole 715 and the other hole for forming the source contact structure. Any suitable film deposition method can be performed to deposit the conductive material. For example, the deposition method may include CVD, PVD, ALD, electroplating, electroless plating, or a combination thereof. In some embodiments, a source contact structure may be formed by the same deposition process that forms second contact portion 716-2. A contact structure 716, having first and second contact portions 716-1 and 716-2 in contact with each other, may be formed extending through insulating structure 718 and base structure 704 (e.g., spacer structure 720), connecting peripheral circuits of the 3D memory device. A lower surface of first contact portion 716-1 may be below the upper surface of spacer structure 720. The upper surface of second contact portion 716-2 may be a flat/leveled surface.

According to one aspect of the present disclosure, a 3D memory device includes a memory stack, a semiconductor layer, a supporting structure, a spacer structure, and a contact structure. The memory stack includes interleaved conductive layers and dielectric layers and comprising a staircase region in a plan view. The semiconductor layer in contact with the memory stack. The supporting structure overlaps the staircase region of the memory stack and coplanar with the semiconductor layer, and the supporting structure includes a material other than a material of the semiconductor layer. The supporting structure and the first semiconductor layer are coplanar. The spacer structure is outside the memory stack and is coplanar with the supporting structure and the semiconductor layer. The contact structure extends vertically and is surrounded by the spacer structure.

In some embodiments, the spacer structure has a trench structure surrounding part of the semiconductor layer, and the part of the semiconductor layer is in contact with contact structure and is insulated from a rest of the semiconductor layer by the spacer structure.

In some embodiments, the spacer structure has a well structure, and a shape of the well structure is different from a shape of the contact structure in the plan view.

In some embodiments, the spacer structure includes a dielectric material.

In some embodiments, the supporting structure and the spacer structure include a same dielectric material.

In some embodiments, the same dielectric material is TEOS.

In some embodiments, the 3D memory device further includes a first slit structure extending vertically and laterally and dividing the memory stack into a plurality of memory blocks.

In some embodiments, the 3D memory device further includes a second slit structure extending vertically and laterally and dividing each memory stack into a plurality of memory fingers.

In some embodiments, the second slit structure stops in the supporting structure, and each memory block overlaps with one supporting structure.

In some embodiments, each of the sub-supporting structure includes a trench structure surrounding part of the semiconductor layer.

In some embodiments, each of the sub-supporting structure includes a well structure filled with the material different than the material of the semiconductor layer.

According to one aspect of the present disclosure, a 3D memory device includes a memory stack, a semiconductor layer, a supporting structure, a spacer structure, a channel structure, and a contact structure. The memory stack includes interleaved conductive layers and dielectric layers and comprising a staircase region in a plan view. The semiconductor layer in contact with the memory stack. The supporting structure overlaps the staircase region of the memory stack and coplanar with the semiconductor layer, and the supporting structure includes a material other than a material of the semiconductor layer. The supporting structure and the first semiconductor layer are coplanar. The spacer structure is outside the memory stack and is coplanar with the supporting structure and the semiconductor layer. The channel structure is in the core array region of the memory stack into the semiconductor layer and includes a semiconductor channel, wherein a lower portion of the semiconductor channel is in contact with the semiconductor layer. The contact structure extends vertically and is surrounded by the spacer structure.

In some embodiments, the spacer structure has a trench structure surrounding part of the semiconductor layer, and the part of the semiconductor layer is in contact with contact structure and is insulated from a rest of the semiconductor layer by the spacer structure.

In some embodiments, the spacer structure has a well structure, and a shape of the well structure is different from a shape of the contact structure in the plan view.

In some embodiments, the spacer structure includes a dielectric material.

In some embodiments, the supporting structure and the spacer structure include a same dielectric material.

In some embodiments, the same dielectric material is TEOS.

In some embodiments, the 3D memory device further includes a first slit structure extending vertically and laterally and dividing the memory stack into a plurality of memory blocks.

In some embodiments, the 3D memory device further includes a second slit structure extending vertically and laterally and dividing each memory stack into a plurality of memory fingers.

In some embodiments, the second slit structure stops in the supporting structure, and each memory block overlaps with one supporting structure.

In some embodiments, each of the sub-supporting structure includes a trench structure surrounding part of the semiconductor layer.

In some embodiments, each of the sub-supporting structure includes a well structure filled with the material different than the material of the semiconductor layer.

In some embodiments, the channel structure further includes a memory layer in contact with and surrounding the semiconductor channel, and a lower portion of the memory layer is disconnected to expose the semiconductor channel such that the semiconductor channel is in contact with the semiconductor layer.

According to still another aspect of the present disclosure, a method for forming a 3D memory device is disclosed. A semiconductor layer including a sacrificial layer is formed on a substrate. A supporting structure and a spacer structure are simultaneously formed in the semiconductor layer. The supporting structure and the spacer structure are coplanar with the semiconductor layer, and the supporting structure includes a material other than a material of the semiconductor layer. A dielectric stack including a staircase region, in contact with the semiconductor layer is formed. The staircase region overlaps with the supporting structure. A contact structure extending vertically and surrounded by the spacer structure is formed.

In some embodiments, to form the spacer structure, a portion of the semiconductor layer is removed to form a spacer structure opening extending through the semiconductor layer and the spacer structure opening is filled with a dielectric material.

In some embodiments, the spacer structure opening has a trench structure, dividing the semiconductor layer into an insulating portion and a sacrificial portion. The insulating portion of the semiconductor layer is in contact with the contact structure, and is insulated from the sacrificial portion of the semiconductor layer by the spacer structure In some embodiments, the spacer structure opening has a well structure, and a shape of the well structure is different from the shape of the contact structure in the plan view.

In some embodiments, at least one first slit structure and at least one second slit structure, extending vertically and laterally in the dielectric stack are form, the at least one first slit structure divides the dielectric stack into a plurality of block regions, and the at least one second slit structure divides each block region into a plurality of finger regions.

In some embodiments, to form the supporting structure, a portion of the semiconductor layer is removed to form a supporting structure opening extending through the semiconductor layer, and the supporting structure opening is filled with the material different than the material of the semiconductor layer.

In some embodiments, a depth of the part of the supporting structure in contact with the first semiconductor layer is greater than a depth of the remainder of the supporting structure.

In some embodiments, to form the second slit structure, a second slit structure opening extending through the dielectric stack stopping in the supporting structure is formed.

In some embodiments, to form the second slit structure, a second slit structure opening extending through the dielectric stack stopping in the semiconductor layer is formed. The second slit structure divides the supporting structure into a plurality of sub-supporting structures.

In some embodiments, the second semiconductor structure further includes a source contact in contact with the second semiconductor layer.

In some embodiments, each sub-supporting structure opening has a trench structure, dividing the semiconductor layer into a supporting portion and a sacrificial portion. The supporting portion of the semiconductor layer overlaps the staircase region of the dielectric stack.

In some embodiments, the sacrificial layer of the sacrificial portion is replaced with a semiconductor sublayer.

In some embodiments, each sub-supporting structure opening has a well structure.

In some embodiments, the supporting structure and the spacer structure includes a same dielectric material.

In some embodiments, the same dielectric material is TEOS.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a memory stack comprising interleaved conductive layers and dielectric layers and comprising a staircase region in a plan view;
a semiconductor layer in contact with the memory stack;
a supporting structure overlapping and arranged within the staircase region of the memory stack to be aligned with the memory stack in a vertical direction of the plan view; and
a source contact structure at a side of the semiconductor layer opposite to the memory stack and in contact with the semiconductor layer,
wherein:
the supporting structure comprises a material other than a material of the semiconductor layer;
a spacer structure is arranged outside the memory stack;
in a lateral direction perpendicular to the vertical direction, the supporting structure is sandwiched within the semiconductor layer without extending to a core array region adjacent to the staircase region;
a contact structure extending vertically and surrounded by the spacer structure;
a stop layer extends, at the side of the semiconductor layer opposite to the memory stack, in the lateral direction, and the supporting structure and the spacer structure terminate on the stop layer; and
the source contact structure penetrates the stop layer to electrically couple with a channel structure through the semiconductor layer.

2. The 3D memory device of claim 1, wherein the spacer structure has a trench structure surrounding part of the semiconductor layer, wherein the part of the semiconductor layer is in contact with the contact structure and is insulated from a rest of the semiconductor layer by the spacer structure.

3. The 3D memory device of claim 1, wherein the spacer structure has a well structure, wherein a shape of the well structure is different from a shape of the contact structure in the plan view.

4. The 3D memory device of claim 1, wherein the spacer structure comprises a dielectric material.

5. The 3D memory device of claim 1, wherein the supporting structure and the spacer structure comprise a same dielectric material.

6. The 3D memory device of claim 5, wherein the same dielectric material is tetraethyl orthosilicate (TEOS).

7. The 3D memory device of claim 1, further comprising a first slit structure extending vertically and laterally and dividing the memory stack into a plurality of memory blocks.

8. The 3D memory device of claim 7, further comprising a second slit structure extending vertically and laterally and dividing each memory stack into a plurality of memory fingers.

9. The 3D memory device of claim 8, wherein the second slit structure stops in the supporting structure, wherein each memory block overlaps with a respective supporting structure.

10. The 3D memory device of claim 8, wherein the second slit structure extends vertically into the semiconductor layer and is configured to divide the supporting structure into a plurality of sub-supporting structures, wherein each memory finger overlaps with one of the sub-supporting structures.

11. The 3D memory device of claim 10, wherein each of the sub-supporting structures comprises a trench structure surrounding part of the semiconductor layer.

12. The 3D memory device of claim 10, wherein each of the sub-supporting structures comprises a well structure filled with the material different than the material of the semiconductor layer.

13. A three-dimensional (3D) memory device, comprising:

a memory stack comprising interleaved conductive layers and dielectric layers and having a core array region and a staircase region in a plan view;

a semiconductor layer in contact with the memory stack;

a supporting structure overlapping and arranged within the staircase region of the memory stack to be aligned with the staircase region in a vertical direction of the plan view, wherein:

the supporting structure comprises a material other than a material of the semiconductor layer, and an upper surface of the supporting structure is flush with an upper surface of the semiconductor layer; and in a lateral direction perpendicular to the vertical direction, the supporting structure is sandwiched within the semiconductor layer;

a spacer structure outside the memory stack;

a source contact structure at a side of the semiconductor layer opposite to the memory stack and in contact with the semiconductor layer;

a channel structure in the core array region of the memory stack and into the semiconductor layer, comprising a semiconductor channel, wherein a lower portion of the semiconductor channel is surrounded by and in direct contact with the semiconductor layer; and a contact structure extending vertically and surrounded by the spacer structure, wherein:

a stop layer extends, at the side of the semiconductor layer opposite to the memory stack, in the lateral direction, and the supporting structure and the spacer structure terminate on the stop layer; and the source contact structure penetrates the stop layer to electrically couple with the channel structure through the semiconductor layer.

14. The 3D memory device of claim 13, wherein the spacer structure has a trench structure surrounding part of the semiconductor layer, wherein the part of the semiconductor layer is in contact with the contact structure and is insulated from a rest of the semiconductor layer by the spacer structure.

15. The 3D memory device of claim 13, wherein the spacer structure has a well structure, wherein a shape of the well structure is different from a shape of the contact structure in the plan view.

16. The 3D memory device of claim 13, further comprising a first slit structure extending vertically and laterally and dividing the memory stack into a plurality of memory blocks.

17. The 3D memory device of claim 16, further comprising a second slit structure extending vertically and laterally and dividing each memory stack into a plurality of memory fingers.

18. The 3D memory device of claim 17, wherein the second slit structure stops in the supporting structure, wherein each memory block overlaps with a respective supporting structure.

19. The 3D memory device of claim 17, wherein the second slit structure extends vertically into the semiconductor layer and is configured to divide the supporting structure into a plurality of sub-supporting structures, wherein each memory finger overlaps with one sub-supporting structure.

* * * * *